US010969436B1

(12) United States Patent
Sarwat et al.

(10) Patent No.: US 10,969,436 B1
(45) Date of Patent: Apr. 6, 2021

(54) SYSTEMS AND METHODS FOR FORECASTING BATTERY STATE OF CHARGE

(71) Applicants: Arif Sarwat, Miami, FL (US); Asadullah Khalid, Miami, FL (US); Aditya Sundararajan, Miami, FL (US)

(72) Inventors: Arif Sarwat, Miami, FL (US); Asadullah Khalid, Miami, FL (US); Aditya Sundararajan, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 17/080,322

(22) Filed: Oct. 26, 2020

Related U.S. Application Data

(60) Provisional application No. 62/926,108, filed on Oct. 25, 2019.

(51) Int. Cl.
*G01R 31/367* (2019.01)
*G01R 31/36* (2020.01)
*G01R 31/387* (2019.01)

(52) U.S. Cl.
CPC ....... *G01R 31/367* (2019.01); *G01R 31/3648* (2013.01); *G01R 31/387* (2019.01)

(58) Field of Classification Search
CPC .................. G01R 31/367; G01R 31/3648
USPC ............................................. 702/63
See application file for complete search history.

(56) References Cited

U.S. PATENT DOCUMENTS

| | | | |
|---|---|---|---|
| 8,332,342 B1* | 12/2012 | Saha | G01R 31/392 706/45 |
| 2018/0017630 A1* | 1/2018 | Schipfer | G01R 31/367 |
| 2019/0157869 A1* | 5/2019 | Gadh | H01M 10/482 |
| 2019/0353711 A1* | 11/2019 | Paulose | H01M 10/42 |

\* cited by examiner

*Primary Examiner* — Ricky Ngon
(74) *Attorney, Agent, or Firm* — Saliwanchik, Lloyd & Eisenschenk

(57) ABSTRACT

Systems and methods for forecasting of State of Charge (SOC) of lithium ion batteries are provided. A multi-step forecasting process with experimentally obtained decreasing C-Rate datasets together with machine learning can be used. The multi-step approach can combine a univariate technique with machine learning techniques. An Auto Regressive Integrated Moving Average (ARIMA) and/or Holt Winters Exponential Smoothing (HWES) can be combined with each other and/or with machine learning techniques such as Multilayer Perceptron (MLP) and Nonlinear autoregressive neural network with external input (NARX-net).

18 Claims, 28 Drawing Sheets

| Forecasted V | ARIMA(4,2,4) | HWES |
|---|---|---|
| MSE | 0.02 | 0.40 |
| RMSE | 0.14 | 0.63 |
| MAE | 0.03 | 0.52 |
| Forecasted I | ARIMA(5,2,0) | HWES |
| MSE | 0.09 | 1.68 |
| RMSE | 0.30 | 1.30 |
| MAE | 0.08 | 0.94 |
| Forecasted SOC% | ARIMA(5,0,2) | HWES |
| MSE | 4.65 | 416.83 |
| RMSE | 2.16 | 20.42 |
| MAE | 0.61 | 14.53 |

FIG. 8

| Optimizers | MLP Model 1 | | | | MLP Model 2 | | | | MLP Model 3 | | | | MLP Model 4 | | | |
|---|---|---|---|---|---|---|---|---|---|---|---|---|---|---|---|---|
| | RMSE | MSE | MAE | Epochs | RMSE | MSE | MAE | Epochs | RMSE | MSE | MAE | Epochs | RMSE | MSE | MAE | Epochs |
| sgd | 10.422 | 1.086 | 8.155 | 143 | 13.705 | 1.878 | 10.925 | 46 | 5.248 | 0.275 | 3.986 | 116 | 7.11 | 0.506 | 4.814 | 50 |
| Adam | 18.428 | 3.396 | 13.913 | 24 | 19.808 | 3.923 | 15.425 | 33 | 5.6 | 0.314 | 4.146 | 22 | 6.212 | 0.386 | 4.315 | 38 |
| RMSprop | 22.724 | 5.164 | 16.992 | 21 | 24.726 | 6.114 | 20.696 | 22 | 16.052 | 2.577 | 11.475 | 44 | 8.8 | 0.774 | 5.703 | 45 |
| AdaGrad | 9.786 | 0.958 | 7.464 | 1000 | 8.808 | 0.776 | 7.379 | 46 | 5.523 | 0.305 | 4.376 | 30 | 7.241 | 0.524 | 5.511 | 25 |
| AdaMax | 10.517 | 1.106 | 8.213 | 40 | 18.417 | 3.392 | 14.768 | 41 | 5.204 | 0.271 | 3.803 | 27 | 4.577 | 0.209 | 2.942 | 86 |
| AdaDelta | 19.942 | 3.977 | 14.808 | 26 | 14.121 | 1.994 | 11.941 | 33 | 11.95 | 1.428 | 8.689 | 26 | 6.028 | 0.363 | 4.177 | 46 |
| NAdam | 11.273 | 1.271 | 8.767 | 31 | 22.361 | 5 | 17.443 | 24 | 5.352 | 0.286 | 3.851 | 29 | 6.009 | 0.361 | 4.509 | 36 |

FIG. 9

| Optimizers | NARX Model 1 | | | | NARX Model 2 | | | | NARX Model 3 | | | |
|---|---|---|---|---|---|---|---|---|---|---|---|---|
| | RMSE | MSE | MAE | Epochs | RMSE | MSE | MAE | Epochs | RMSE | MSE | MAE | Epochs |
| br | 6.0273 | 36.3287 | 5.1302 | 1000 | 23.8759 | 570.0594 | 21.591 | 1000 | 29.7022 | 882.2191 | 19.9626 | 1000 |
| lm | 0.5107 | 0.2609 | 0.4095 | 55 | 2.7415 | 7.5156 | 2.2278 | 39 | 11.2905 | 127.4753 | 8.2622 | 404 |
| scg | 0.2488 | 0.0619 | 0.2136 | 62 | 0.4287 | 0.1838 | 0.361 | 62 | 0.2337 | 0.0546 | 0.1739 | 75 |
| GDX | 0.1210 | 0.0146 | 0.0832 | 160 | 0.0942 | 0.0089 | 0.0626 | 159 | 0.2547 | 0.0649 | 0.2118 | 166 |
| gd | 0.3908 | 0.1528 | 0.316 | 1000 | 0.2395 | 0.0574 | 0.1702 | 1000 | 0.3808 | 0.145 | 0.322 | 1000 |
| gdm | 0.3499 | 0.1224 | 0.3171 | 1000 | 0.2501 | 0.0626 | 0.1761 | 20 | 1.1271 | 1.2703 | 1.0775 | 1000 |
| bfg | 0.2383 | 0.0568 | 0.1925 | 78 | 0.3089 | 0.0954 | 0.2812 | 91 | 1.1412 | 1.3023 | 0.8793 | 53 |
| rprop | 0.1994 | 0.0397 | 0.1613 | 142 | 0.1155 | 0.0134 | 0.0887 | 359 | 0.1537 | 0.0236 | 0.1186 | 128 |
| cgb | 1.413 | 1.9966 | 1.2294 | 235 | 0.352 | 0.1239 | 0.3179 | 56 | 0.451 | 0.2034 | 0.3554 | 132 |
| cgf | 1.0032 | 1.0065 | 0.7659 | 280 | 0.5962 | 0.3555 | 0.5556 | 91 | 0.6248 | 0.3904 | 0.498 | 133 |
| cgp | 0.8182 | 0.6695 | 0.7857 | 77 | 0.2299 | 0.0529 | 0.1793 | 101 | 0.3437 | 0.1181 | 0.2495 | 66 |
| oss | 0.4761 | 0.2266 | 0.4195 | 24 | 0.3576 | 0.1279 | 0.3262 | 173 | 0.2199 | 0.0483 | 0.153 | 132 |

FIG. 10

| Optimizers | MLP Model 1 | | | MLP Model 2 | | |
|---|---|---|---|---|---|---|
| | RMSE | MSE | MAE | RMSE | MSE | MAE |
| AdaGrad | 3.2367 | 10.4763 | 2.4688 | 5.8169 | 33.8365 | 4.8732 |
| AdaMax | 3.4780 | 12.0962 | 2.7161 | 12.1620 | 147.9135 | 9.7520 |

FIG. 11

| Optimizers | NARX Model 1 | | | NARX Model 2 | | |
|---|---|---|---|---|---|---|
| | RMSE | MSE | MAE | RMSE | MSE | MAE |
| GDX | 0.1323 | 0.0175 | 0.0888 | 0.3299 | 0.1088 | 0.2490 |
| rprop | 0.2046 | 0.0419 | 0.1666 | 0.4089 | 0.1672 | 0.3288 |

FIG. 12

SYSTEMS AND METHODS FOR FORECASTING BATTERY STATE OF CHARGE

CROSS-REFERENCE TO A RELATED APPLICATION

This application claims the benefit of U.S. Provisional Application Ser. No. 62/926,108, filed Oct. 25, 2019, which is hereby incorporated by reference herein in its entirety, including any figures, tables, and drawings.

GOVERNMENT SUPPORT

This invention was made with government support under Award number CNS-1553494 awarded by National Science Foundation. The government has certain rights in the invention.

BACKGROUND

Severe and possibly irreversible environmental issues have forced the advancement of wind, solar, and other green energies. Although various techniques have been developed to minimize energy consumption and the future of these technologies is promising, wind and solar face significant challenges in the high penetration scenarios in the near future, especially in deriving intelligence, reliability, and resilience through the large amounts of data harnessed from them. These technologies come at a cost, given the rising threats to their safety and reliability. Malicious actors have been able to fully control battery management systems (BMSs) that could potentially be life-threatening to consumers.

With energy storage being a challenge, many works exist in the literature that identify new and innovative ways to store energy. The state of charge (SOC) and voltage of a battery increase with an increase in current, and this results in an increase in temperature of Li-ion cells that could be dangerous for electric vehicles (EVs) with a potential of thermal runaway.

Remaining charge or capacity identification is the key component in real-time monitoring of battery performance. Existing identification mechanisms face hindrances for Li-ion batteries internally due to solid electrolyte interface deposition on the electrode surface and externally due to analog-to-digital module restrictions. In electrochemistry terminology, the capacity of a battery is defined as the amount of remaining active electrode material in the battery. In other words, the capacity availability of the battery is contingent upon the rate with which the battery is being discharged, also termed as the C-Rate. The C-Rate is thus a parameter that, when tuned, indirectly emulates a load connected to a battery. State-of-Charge (SOC) refers to the amount of capacity that can be utilized by the battery. With age or load applications, this capacity value downgrades during charging and discharging cycles. This downgrade in capacity can happen under four scenarios: i) rest or standby condition; ii) external influence; iii) fault condition; or iv) constrained cycling condition.

In a rest or a standby condition that lasts for months (not to be confused with rest between lifecycles) under anomalous temperatures, storage degradation occurs reducing the calendar life of the batteries. External influences could include, but are not limited to, a request for peak shaving or load leveling for a primary or secondary distribution level requirement, or high power, high rate charging of electric vehicle batteries. Fault conditions could include, but are not limited to, insulation damage, internal short circuits that can be a result of external influences as well, which went unnoticed.

BRIEF SUMMARY

Embodiments of the subject invention provide novel and advantageous systems and methods for forecasting of State of Charge (SOC) of batteries (e.g., lithium batteries such as lithium ion (Li-ion) batteries). In contrast to conventional single-step forecasting approaches, embodiments can use a multi-step forecasting process with experimentally obtained decreasing C-Rate datasets together with machine learning. The multi-step approach can combine at least one univariate technique with machine learning techniques; for example, Auto Regressive Integrated Moving Average (ARIMA) and Holt Winters Exponential Smoothing (HWES) can be combined with each other and/or with machine learning techniques such as Multilayer Perceptron (MLP) and Nonlinear autoregressive neural network with external input (NARX-net). Various combinations of univariate and machine learning techniques can be implemented.

In an embodiment, a system for forecasting SOC of a battery (e.g., a Li-ion battery) can comprise: a battery analyzer configured to connect to the battery; a processor in operable communication with the battery analyzer; and a machine-readable medium in operable communication with the processor and the battery analyzer, the machine-readable medium having instructions stored thereon that, when executed by the processor, perform the following steps: obtaining data about the battery from the battery analyzer; forecasting a first C-rate, a voltage, a current, and a SOC percentage (SOC %) of the battery using a univariate model with parameters from at least one second C-rate, each second C-rate of the at least one second C-rate being higher than the first C-rate; and providing the forecasted first C-rate, voltage, current, and SOC % to a machine learning model to obtain a forecasted SOC of the battery. The univariate model can be, for example, an ARIMA model and/or an HWES model. The machine learning model can be, for example, an MLP model or a NARX-net model. The first C-rate can be, for example, a C/10 C-rate, and/or the at least one second C-rate can comprise, for example, one or more of a C/2 C-rate, a C/4 C-rate, a C/6 C-rate, and a C/8 C-rate. The providing of the forecasted first C-rate, voltage, current, and SOC % to the machine learning model to obtain the forecasted SOC of the battery can comprise using an optimizer together with the machine learning model. The optimizer can be, for example, a Variable Learning Rate Gradient Descent (GDX) optimizer or an AdaGrad optimizer. The parameters from the at least one second C-rate can be stored on the machine-readable medium after being obtained by the battery analyzer (e.g., to train the machine learning model(s) prior to the forecasting steps). The forecasted SOC of the battery can be provided to a display in operable communication with the processor, the machine-readable medium, and/or the battery analyzer.

In another embodiment, a method for forecasting SOC of a battery (e.g., a Li-ion battery) can comprise: obtaining (e.g., by a processor in operable communication with a battery analyzer connected to the battery) data about the battery from the battery analyzer connected to the battery; forecasting (e.g., by the processor) a first C-rate, a voltage, a current, and a SOC percentage (SOC %) of the battery using a univariate model with parameters from at least one second C-rate, each second C-rate of the at least one second C-rate being higher than the first C-rate; and providing (e.g., by the processor) the forecasted first C-rate, voltage, current, and SOC % to a machine learning model to obtain a forecasted SOC of the battery. The univariate model can be, for example, an ARIMA model and/or an HWES model. The machine learning model can be, for example, an MLP model or a NARX-net model. The first C-rate can be, for example, a C/10 C-rate, and/or the at least one second C-rate can comprise, for example, one or more of a C/2 C-rate, a C/4 C-rate, a C/6 C-rate, and a C/8 C-rate. The providing of the forecasted first C-rate, voltage, current, and SOC % to the machine learning model to obtain the forecasted SOC of the battery can comprise using an optimizer together with the machine learning model. The optimizer can be, for example, a GDX optimizer or an AdaGrad optimizer. The parameters from the at least one second C-rate can be stored on the machine-readable medium after being obtained by the battery analyzer (e.g., to train the machine learning model(s) prior to the forecasting steps). The forecasted SOC of the battery can be provided to a display in operable communication with the processor, the machine-readable medium, and/or the battery analyzer.

BRIEF DESCRIPTION OF DRAWINGS

FIG. 8 shows V, I, and SOC % forecasting errors using ARIMA and HWES.

FIG. 9 shows SOC % prediction errors using MLP models.

FIG. 10 shows SOC % prediction errors using NARX-net models.

FIG. 11 shows SOC prediction errors on best performing optimizers using multi-step forecasting MLP models with original SOC % as testing data.

FIG. 12 shows SOC prediction errors on best performing optimizers using multi-step forecasting NARX-net models with original SOC % as testing data.

DETAILED DESCRIPTION

Figure 1:
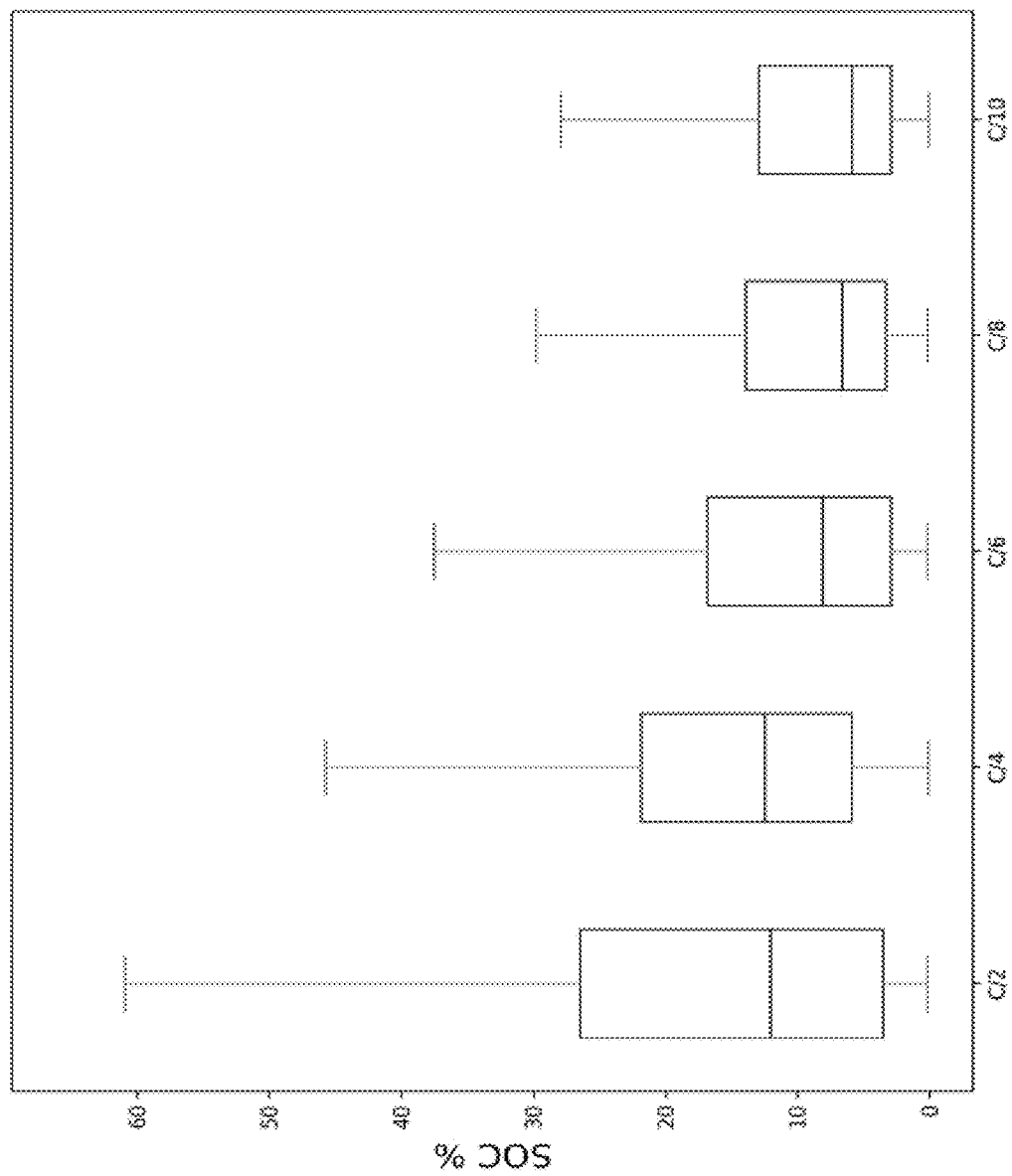
FIG. 1 shows a plot of computed state of charge percentage (SOC %) range for C/2, C/4, C/6, C/8, and C/10 C-rates. C/2 rate is the amperage required to discharge ½ of the entire battery in one hour (e.g., for a 100 Amp-hour (A-h) battery, the C/2 rate would be 50 Amps (A)); similarly, C/4 rate is the amperage required to discharge ¼ of the entire battery in one hour, C/6 rate is the amperage required to discharge ⅙ of the entire battery in one hour, C/8 rate is the amperage required to discharge ⅛ of the entire battery in one hour, and C/10 rate is the amperage required to discharge 1/10 of the entire battery in one hour.

Embodiments of the subject invention provide novel and advantageous systems and methods for forecasting of State of Charge (SOC) of batteries (e.g., lithium batteries such as lithium ion (Li-ion) batteries). In contrast to conventional single-step forecasting approaches, embodiments can use a multi-step forecasting process with experimentally obtained decreasing C-Rate datasets together with machine learning. The multi-step approach can combine at least one univariate technique with machine learning techniques; for example, Auto Regressive Integrated Moving Average (ARIMA) and Holt Winters Exponential Smoothing (HWES) can be combined with each other and/or with machine learning techniques such as Multilayer Perceptron (MLP) and Nonlinear autoregressive neural network with external input (NARX-net). The multi-step approach can identify C/10 C-Rate SOC % with low error values (e.g., root mean squared error (RMSE) of less than 5 (for example, RMSE of less than 3.3, less than 0.20 or even less than 0.14). Various combinations of univariate and machine learning techniques can be implemented.

The performance of various combinations of univariate and machine learning techniques was evaluated for a variety of optimizers in the Examples herein, with results confirming an improvement in performance (e.g., RMSE improvement from 5.5 to 3.2) when ARIMA-MLP combination is used instead of a standalone MLP model, when using an AdaGrad optimizer. Similarly, the ARIMA-NARX-net combination performs better than a standalone NARX model (with RMSE improvement from 0.2547 to 0.1323), using a Variable Learning Rate Gradient Descent (GDX) optimizer. Overall, NARX models showed superior performance to MLP models, both in terms of convergence speed (epochs) and error values when identifying lower C-Rate SOC % from predicted C-Rate datasets, in multi-step forecasting.

In view of the challenges discussed in the Background above, the prediction of state of charge (SOC) with an increase in the number of charging-discharging cycles and varying capacities is required to analyze the status of a battery under different charging-discharging scenarios. To reduce the design complexity of electric vehicles (EVs), the battery parameters, which include SOC, must be predicted accurately. Motivations to predict SOC include: (1) to identify the aging of a battery and determine when it should be replaced; and (2) to reduce the design complexity of EVs. Results from the prediction can be used to program controllers of EVs, where the required heat sink or ducts can be installed during the design or development phases. The SOC depends on the cell voltage, cell current, cell temperature, and elapsed time that represents the overall lifecycle testing time of the battery.

Of the scenarios mentioned in the Background above for which downgrade in battery capacity can occur, constrained cycling condition is the most favorable approach, which takes into account limits on C-Rate, voltage range, and capacity (charging/discharging current) range, while allowing a defined resting period (also termed as self-recharge, usually for minutes) between cycles/half-cycles, and performing cycling in a controlled thermal environment. In a constrained cycling condition, the cycle life downgrades with the increase in temperature, and the power capability downgrades with the decrease in temperature; hence an optimal range is defined in a controlled environment. Embodiments of the subject invention can emulate decrease in C-Rate and forecast data obtained corresponding to the decrease in C-rate. Embodiments of the subject invention can: compare the performance of univariate models forecasting battery parameters for lower charging/discharging rate (C-rate), given preliminary data of higher C-rates; (2) analyze and compare the performances of different multilayer perceptron (MLP) and nonlinear autoregressive neural network with external input (NARX-net) optimizers used to train the neural network models, in standalone and multistep forecasting scenarios; and (3) evaluate the performance of an MLP predictive model by increasing input features from experimentally obtained values.

Forecasting categorizations for SOC in a Li-ion battery can include electrical model based, electrochemical approach based, and machine learning approach based techniques. The electrical and electrochemical approaches can be collectively termed as model-based approaches. The electrical approach involves battery modeling for parameter identification, followed by implementation of filters or observers for state identification. Similarly, the electrochemical approach involves development of electrochemical models by obtaining model impedance information either via testing using electrochemical impedance spectroscopy (EIS) equipment or by mathematical modeling. The requirement of solving a given number of partial derivatives using variety of parameters makes implementation of model-based techniques complex. Additionally, the performance and efficiency of the battery models deviates from a practical scenario with this approach. The machine learning based techniques can be implemented either in a standalone form or in combination with one or more model based approach to improve the overall forecasting performance. In standalone form, various optimization algorithms can be improved upon and added onto the neural networks or their analogous counterparts.

Embodiments of the subject invention improve upon related art forecasting by providing multi-step forecasting by combining at least one univariate model (e.g., ARIMA and/or HWES) with at least one machine learning model (e.g., MLP and/or NARX-net) in a data-driven approach. This data-driven approach can focus on forecasting SOC % corresponding to a C-rate value, which can indicate a driving pattern in electric vehicles or a grid request scenario in the case of microgrids, in a practical sense. SOC % can be computed using a Coulomb Counting method, which is formulated by:

$$SOC_{t_0+\Delta t} = SOC_{t_0} + \frac{\int_{t_0}^{t_0+\Delta t} I dt}{C_p} \times 100\%, \quad (1)$$

where $SOC_{t_0}$ is SOC % at an initial time instance $t_0$, $\Delta t$ is a time interval between two examination points, $SOC_{t_0+\Delta t}$ is the SOC % at $\Delta t$ after the initial time instance ($t_0$), $C_p$ is the maximum rated cell capacity (in Amp-hours (Ah)), and I is the current.

The ARIMA, HWES, MLP, and NARX-net models will be described in more detail, along with the steps involved in their formulation.

ARIMA Models

Modeling a univariate predictive method like ARIMA involves three steps: identification of a time-series training and testing data to be fed into the model and for evaluating the performance of the model respectively; stationarity check for the time-series dataset; and identification of p (autoregressive term), d (integrated term), and q (moving average term) values satisfying the lag polynomial equation, shown in Equation (2) using the training data.

$$\zeta(L)(1-L)^d \hat{y}_{x_0}(t) = \vartheta(L) \in (t) \qquad (2),$$

where $\zeta(L)$ is the weight update corresponding to the p term, L is the lag operator containing the p term, $\vartheta(L)$ is the weight update corresponding to the q term, d is a NARX-net input delay, $\in(t)$ is an IID error with a $\mu=0$ and constant variance (represented by $\sim N(0, \sigma^2)$), and $\hat{y}_{x_0}(t)$ is data output from the model, where $x_o$ represents ARIMA predicted data corresponding to C/10 C-rate. In order to address the requirements of the first step, V, I, and the computed SOC % training data corresponding to C/2 through C/8 rates are concatenated in the order of decreasing C-rates. V, I, and computed SOC % values are then individually fed into the model, thus creating three different time-domain based ARIMA models. Following data identification, stationarity check is performed using a type of unit root test called an Augmented Dickey Fuller (ADF) stationarity test. Based on the ADF test conducted on each of V, I, and the computed SOC % values, the null hypothesis 0 was rejected, as the p-value was found to be less than 0.01 and a test statistic value of $\leq -26$ was obtained for all three datasets. This highly negative statistics value, along with the p-value being smaller than 0.05, indicated that all three datasets lack unit roots and are stationary.

---

Algorithm 1 ARIMA Parameters Identification Algorithm

```
1:   aic_final := Inf
2:   [p, d, q] = [0,0,0], where p,d,q ∈ ℤ⁺
3:   for ([P,D,Q,] := 1:[p_max,d_max,q_max]), where p,d,q ∈ ℤ⁺ do
4:      aic_temp := AIC(ARIMA(y_xi(t), P, D, Q))
5:      if aic_temp < aic_final then
6:         aic_final := aic_temp
7:         [p,d,q] := [P,D,Q]
8:      end if
9:   end for
10:  Return ARIMA(y_xj(t),p, d, q)
```
---

Figure 5A:
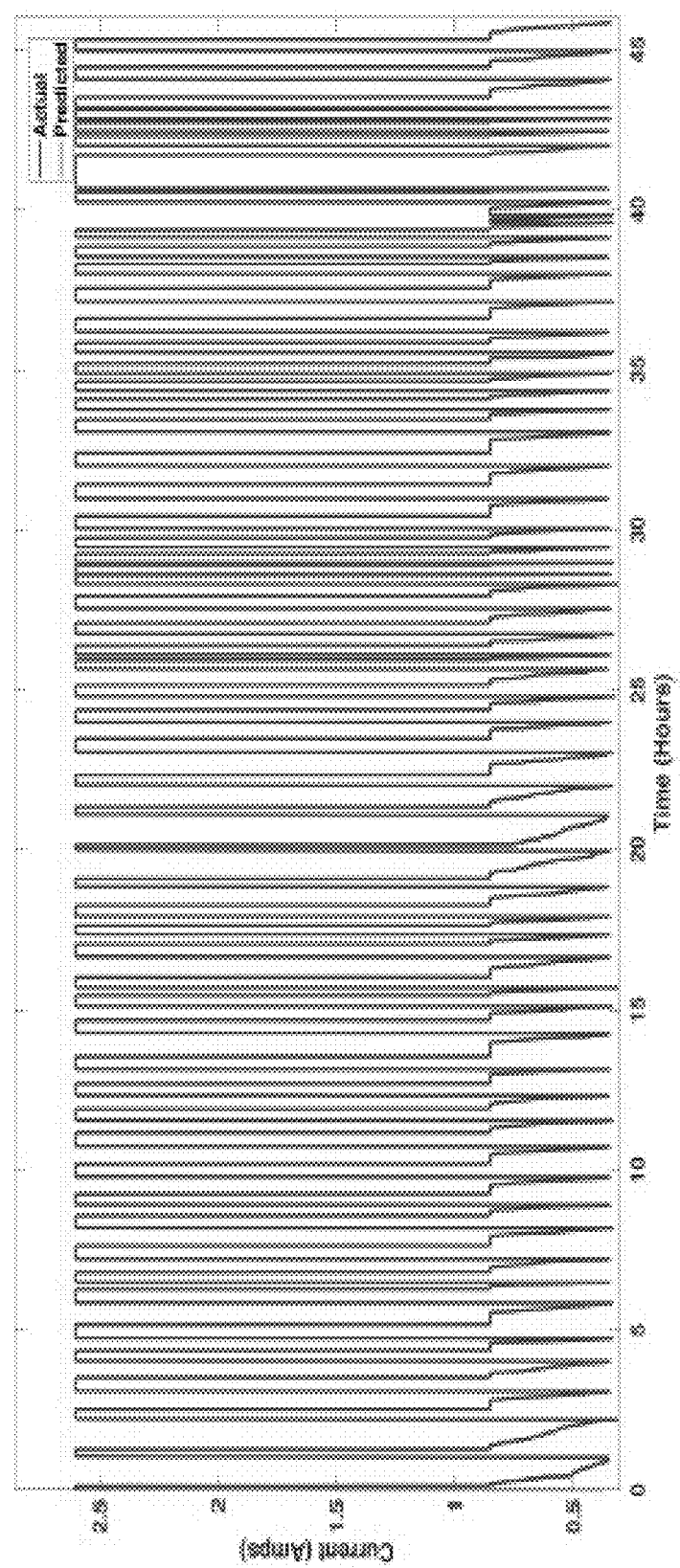
FIG. 5(a) shows a plot of SOC % versus time (in hours (h)) showing a comparison of actual and forecasted/predicted values of SOC % for C/10 C-rate obtained using C/2, C4, C/6, and C/8 current (1) values with Auto Regressive Integrated Moving Average (ARIMA).
Figure 5B:
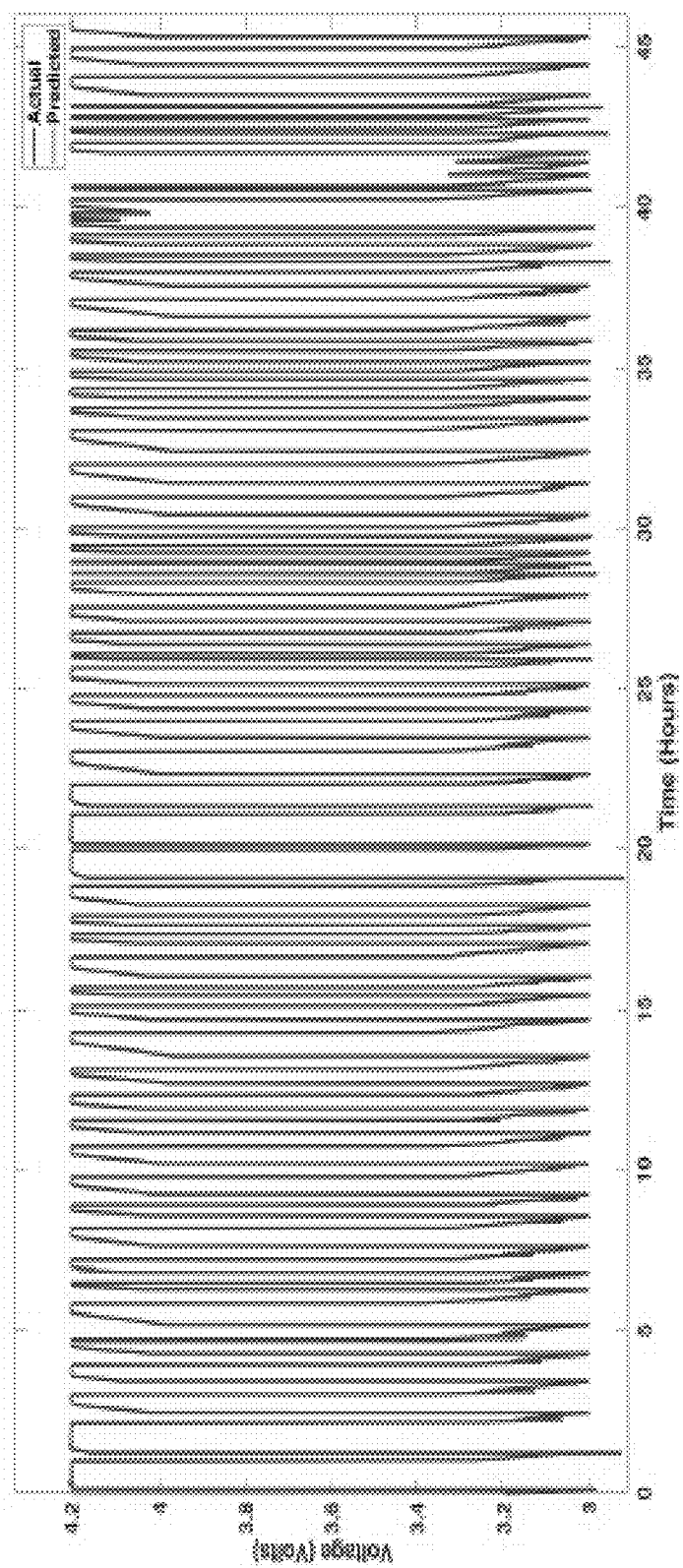
FIG. 5(b) shows a plot of SOC % versus time (in h) showing a comparison of actual and forecasted/predicted values of SOC % for C/10 C-rate obtained using C/2, C4, C/6, and C/8 voltage (V) values with ARIMA.
Figure 5C:
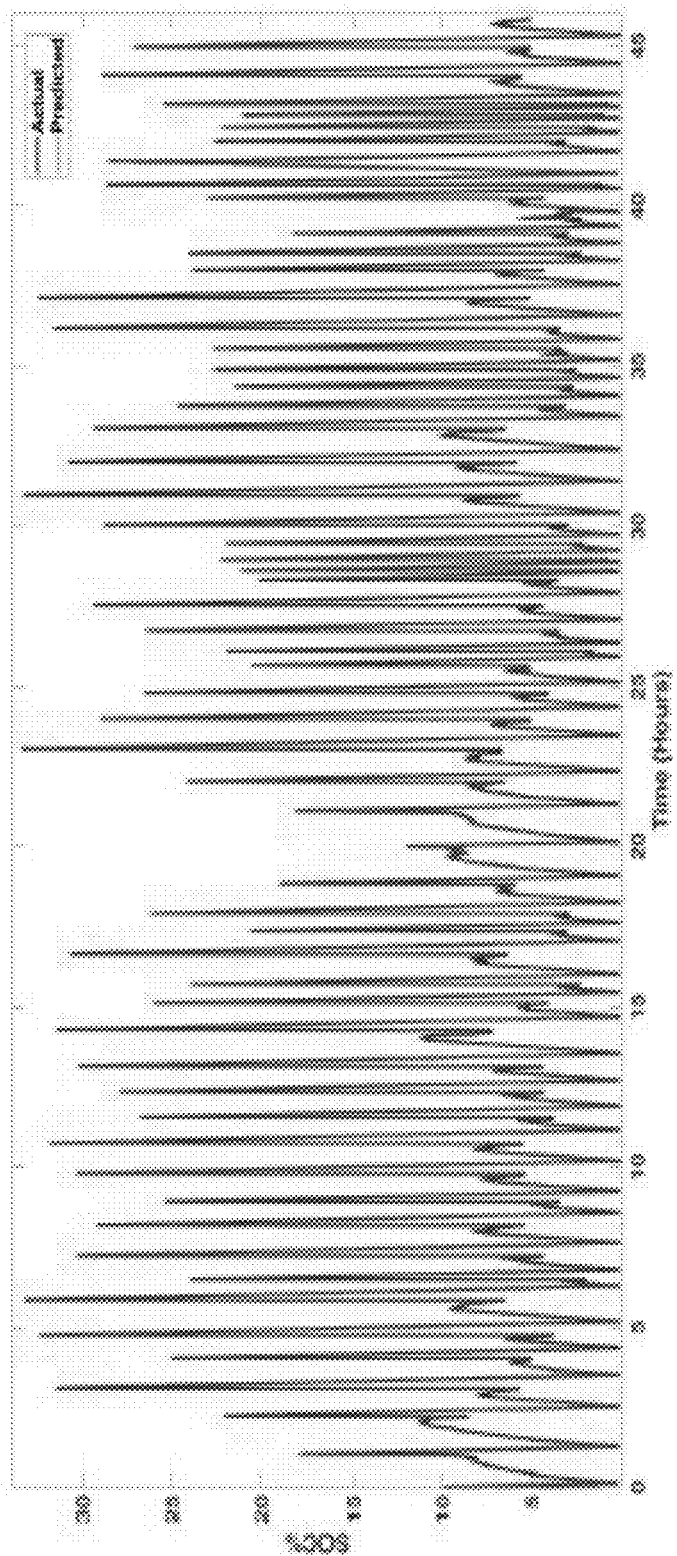
FIG. 5(c) shows a plot of SOC % versus time (in h) showing a comparison of actual and forecasted/predicted values of SOC % for C/10 C-rate obtained using C/2, C4, C/6, and C/8 SOC % values with ARIMA.
Figure 5D:
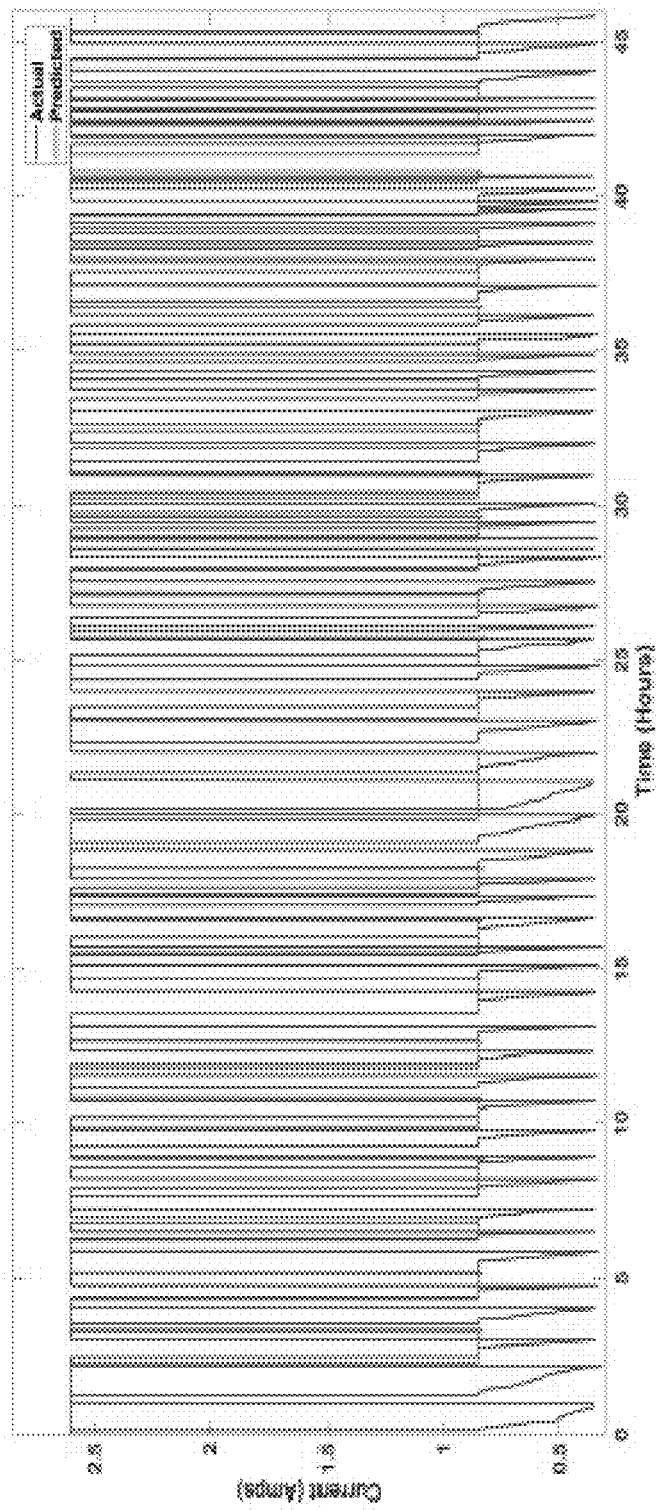
FIG. 5(d) shows a plot of SOC % versus time (in h) showing a comparison of actual and forecasted/predicted values of SOC % for C/10 C-rate obtained using C/2, C4, C/6, and C/8 I with Holt Winters Exponential Smoothing (HWES).
Figure 5E:
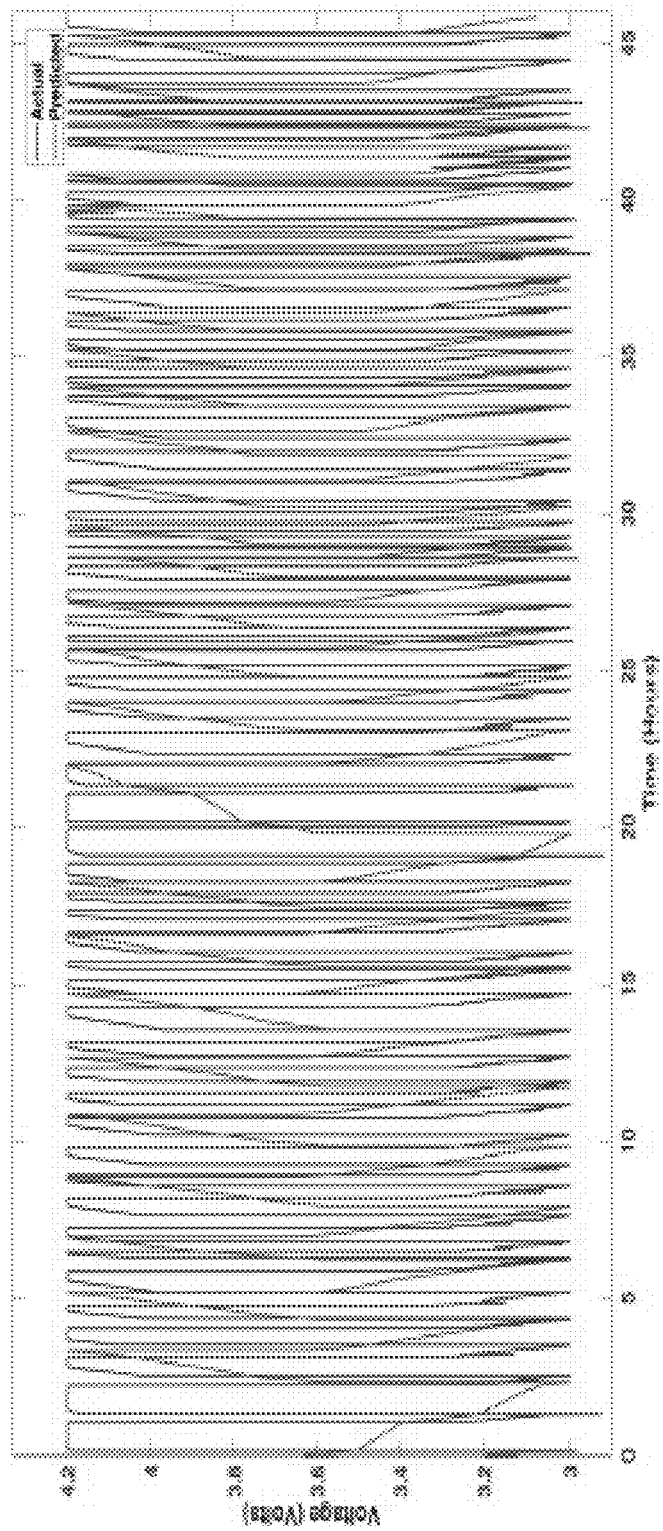
FIG. 5(e) shows a plot of SOC % versus time (in h) showing a comparison of actual and forecasted/predicted values of SOC % for C/10 C-rate obtained using C/2, C4, C/6, and C/8 V values with HWES.
Figure 5F:
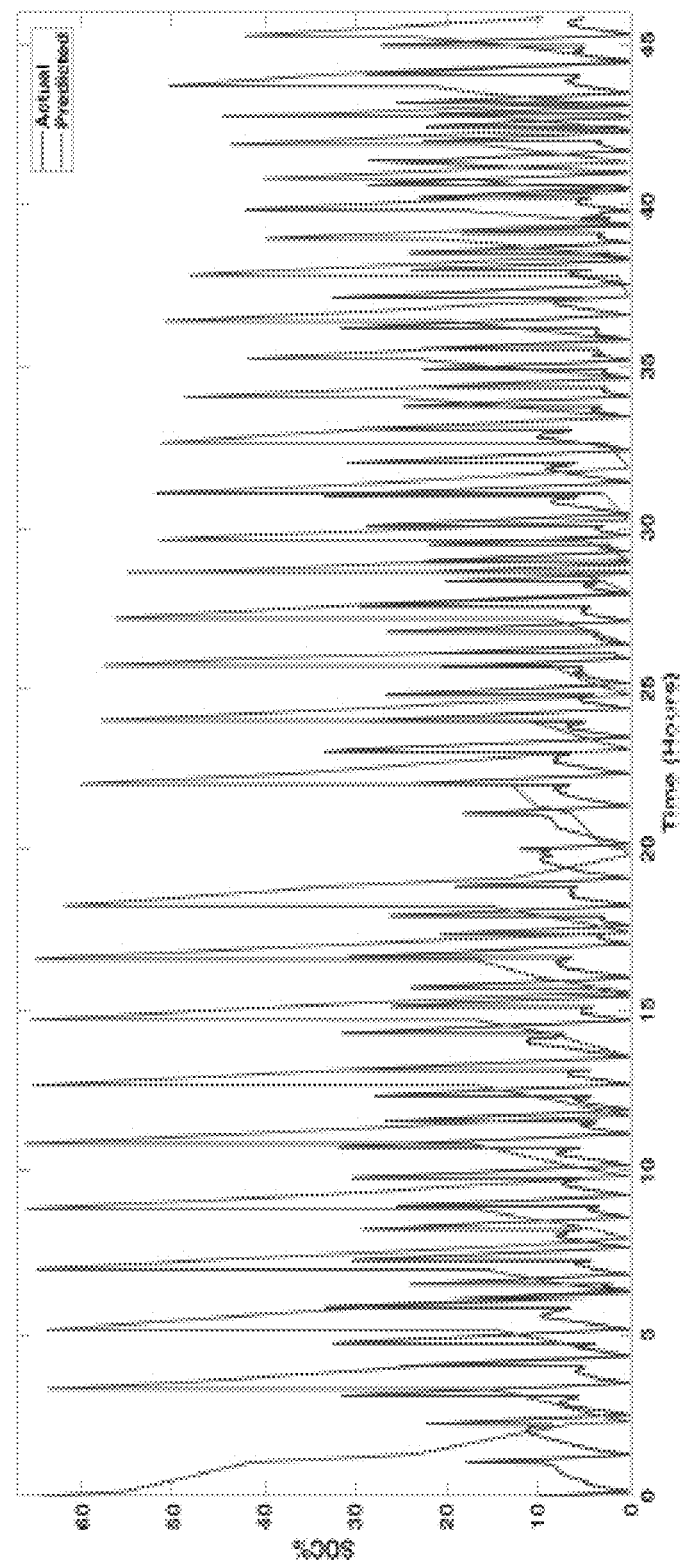
FIG. 5(f) shows a plot of SOC % versus time (in h) showing a comparison of actual and forecasted/predicted values of SOC % for C/10 C-rate obtained using C/2, C4, C/6, and C/8 SOC % values with HWES.
Figure 6A:
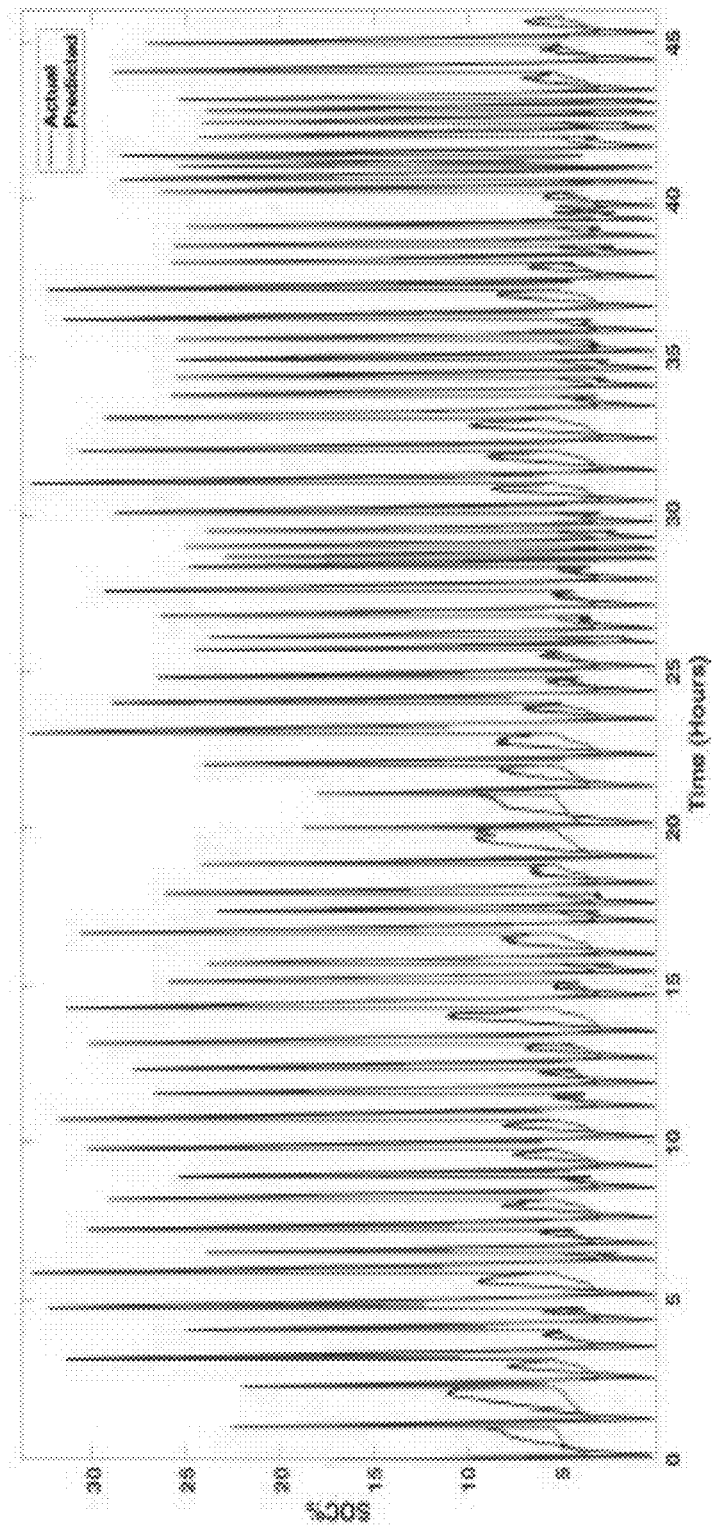
FIG. 6(a) shows a plot of SOC % versus time (in h) showing a comparison of actual and MLP forecasted/predicted values of SOC % for C/10 C-rate obtained using AdaGrad with ARIMA forecasted (MLP model 1) values.
Figure 6B:
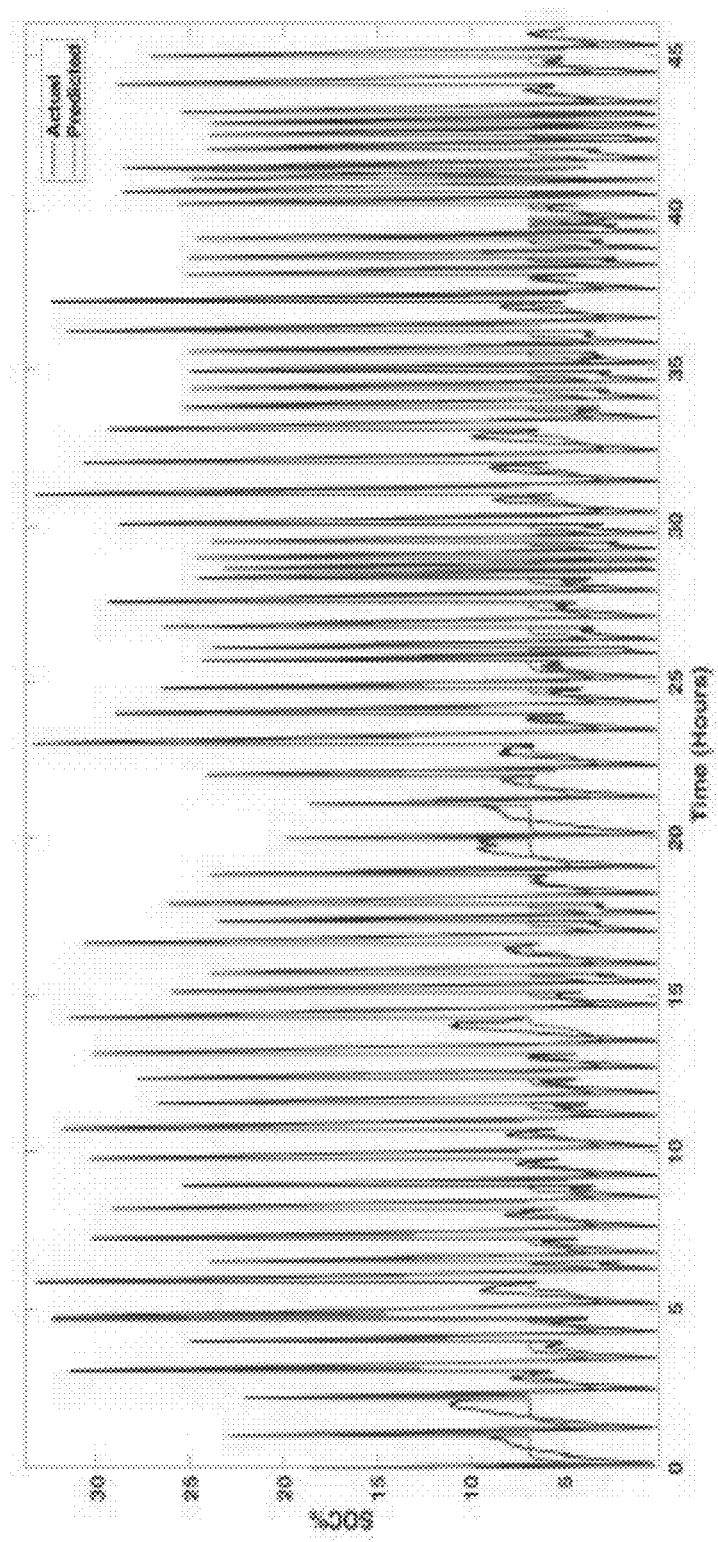
FIG. 6(b) shows a plot of SOC % versus time (in h) showing a comparison of actual and MLP forecasted/predicted values of SOC % for C/10 C-rate obtained using AdaMax with ARIMA forecasted (MLP model 1) values.
Figure 6C:
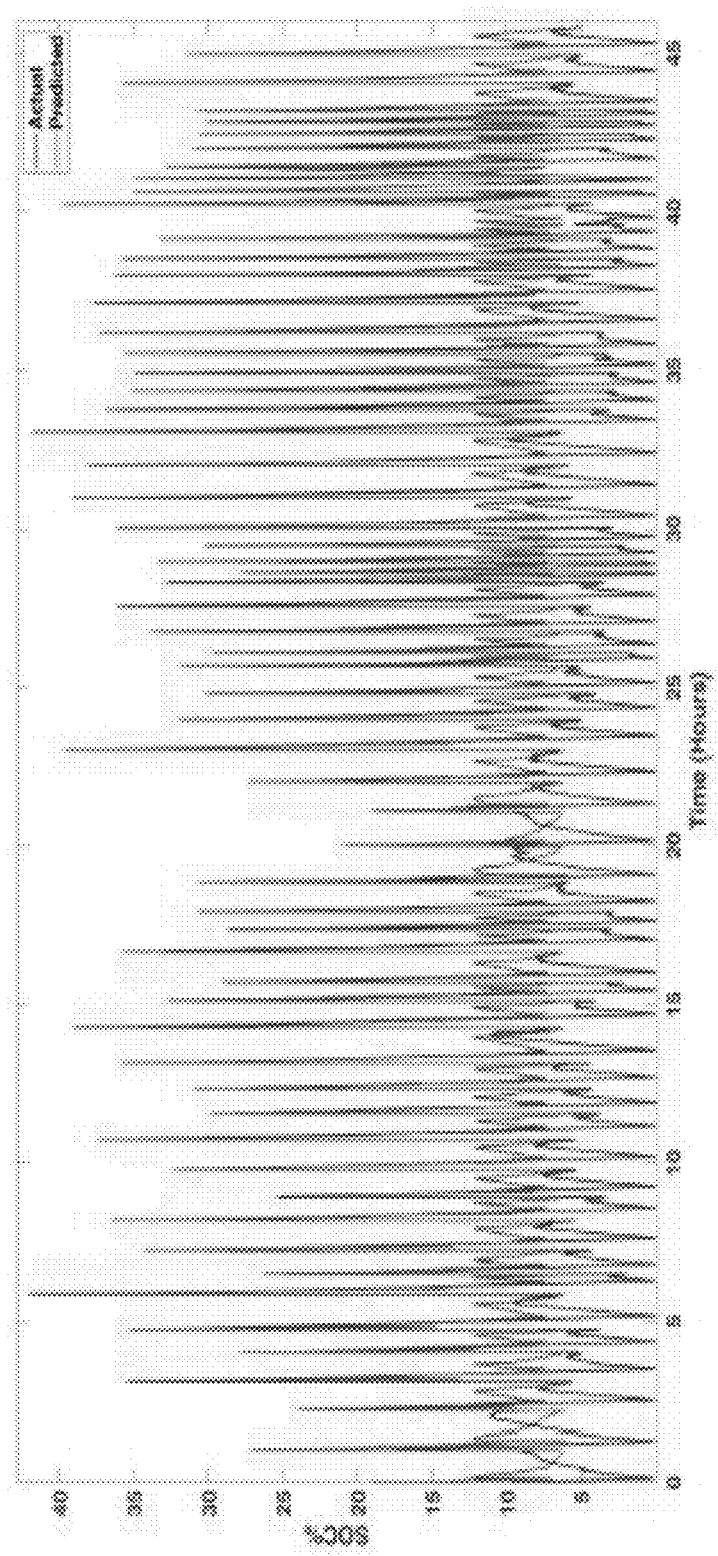
FIG. 6(c) shows a plot of SOC % versus time (in h) showing a comparison of actual and MLP forecasted/predicted values of SOC % for C/10 C-rate obtained using AdaGrad with HWES forecasted (MLP model 2) values.
Figure 6D:
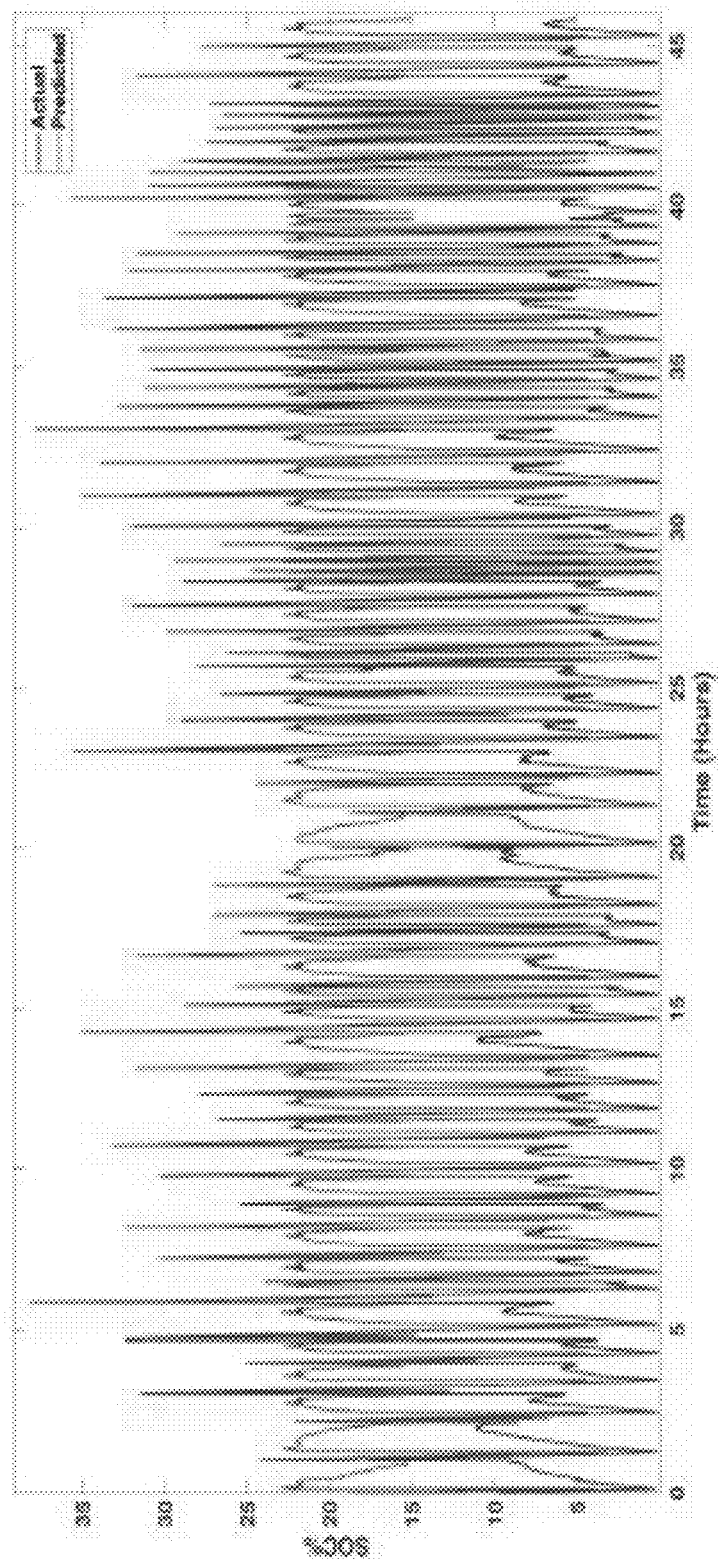
FIG. 6(d) shows a plot of SOC % versus time (in h) showing a comparison of actual and MLP forecasted/predicted values of SOC % for C/10 C-rate obtained using AdaMax with HWES forecasted (MLP model 2) values.
Figure 6E:
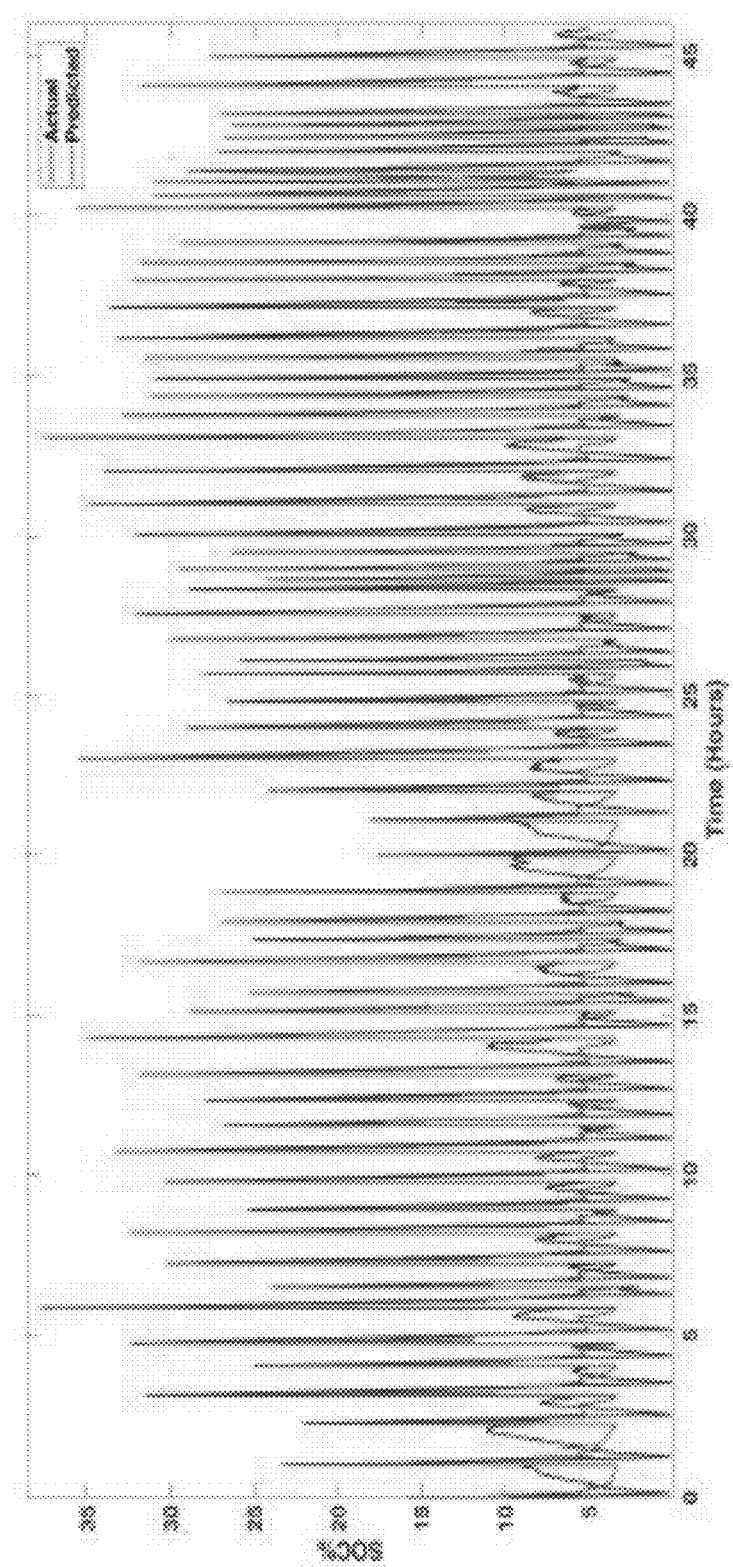
FIG. 6(e) shows a plot of SOC % versus time (in h) showing a comparison of actual and MLP forecasted/predicted values of SOC % for C/10 C-rate obtained using AdaGrad with observed (MLP model 3) values.
Figure 6F:
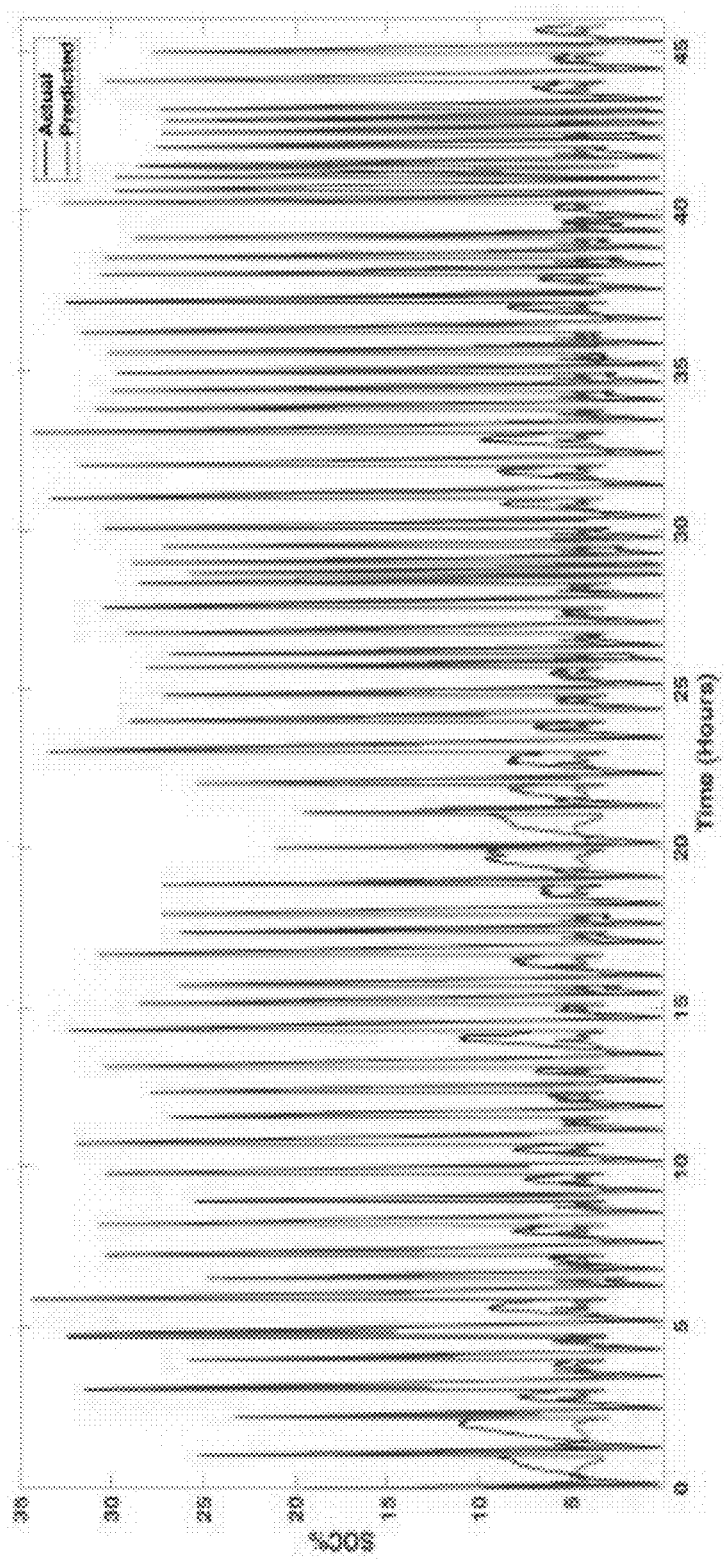
FIG. 6(f) shows a plot of SOC % versus time (in h) showing a comparison of actual and MLP forecasted/predicted values of SOC % for C/10 C-rate obtained using AdaMax with observed (MLP model 3) values.
Figure 6G:
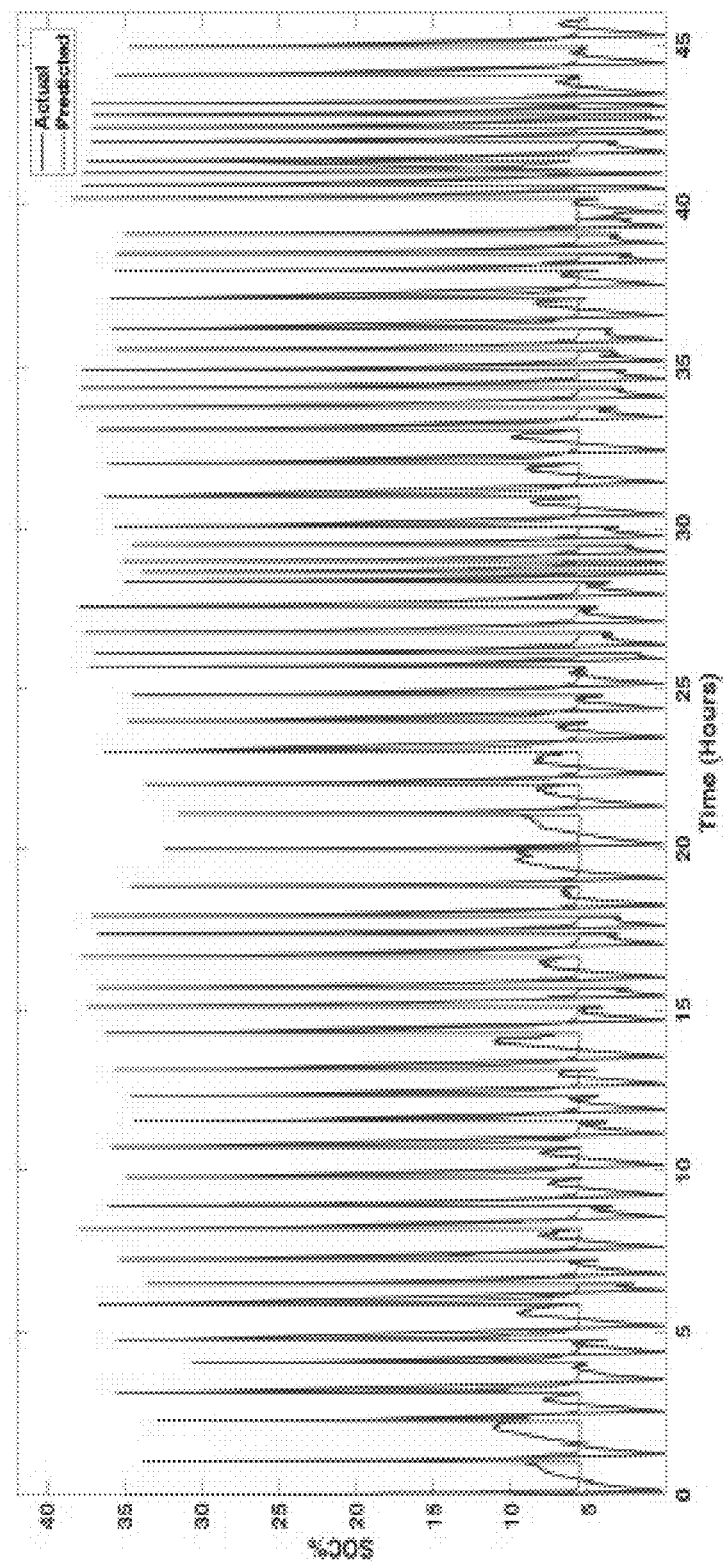
FIG. 6(g) shows a plot of SOC % versus time (in h) showing a comparison of actual and MLP forecasted/predicted values of SOC % for C/10 C-rate obtained using AdaGrad with additional observed (MLP model 4) values.
Figure 6H:
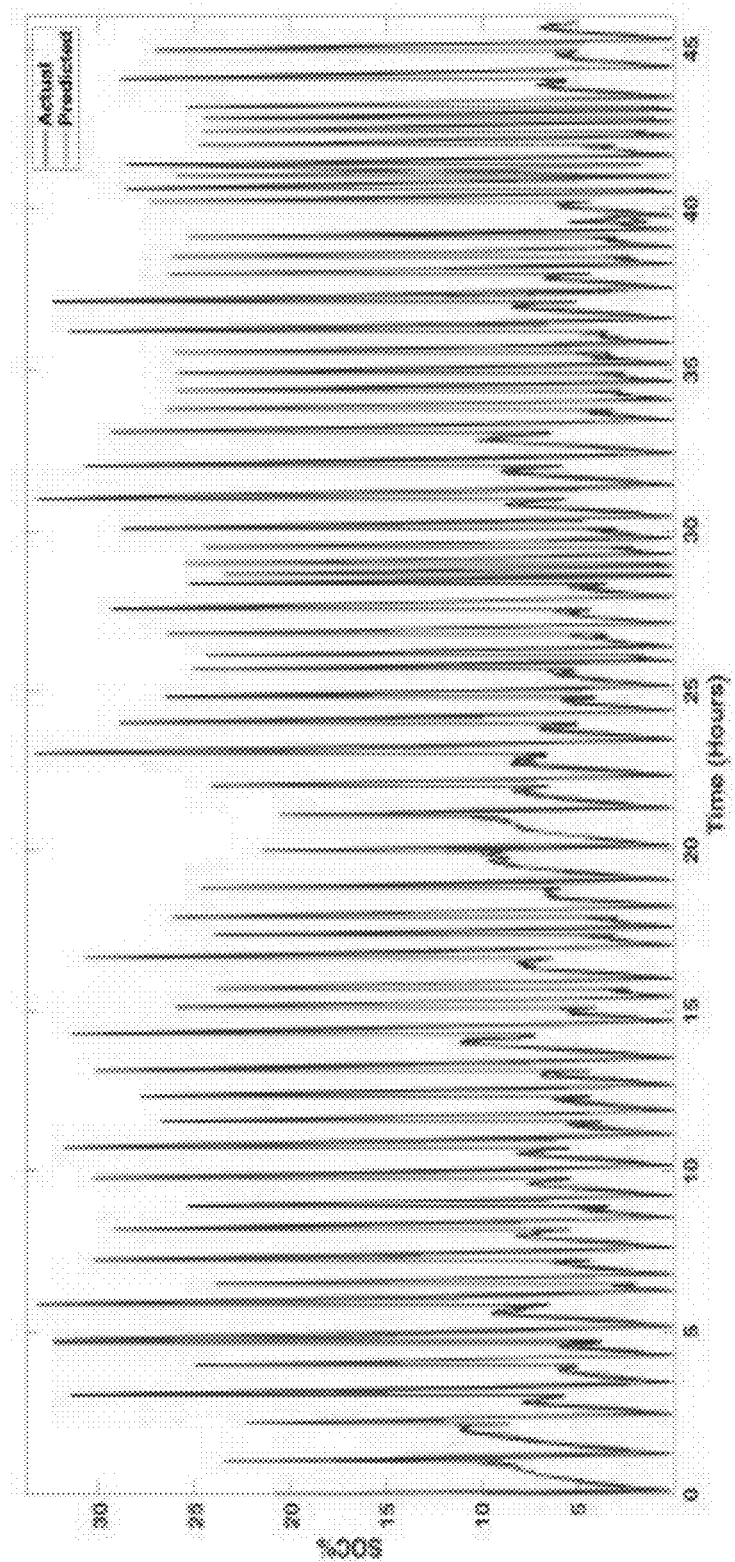
FIG. 6(h) shows a plot of SOC % versus time (in h) showing a comparison of actual and MLP forecasted/predicted values of SOC % for C/10 C-rate obtained using AdaMax with additional observed (MLP model 4) values.
Figure 7A:
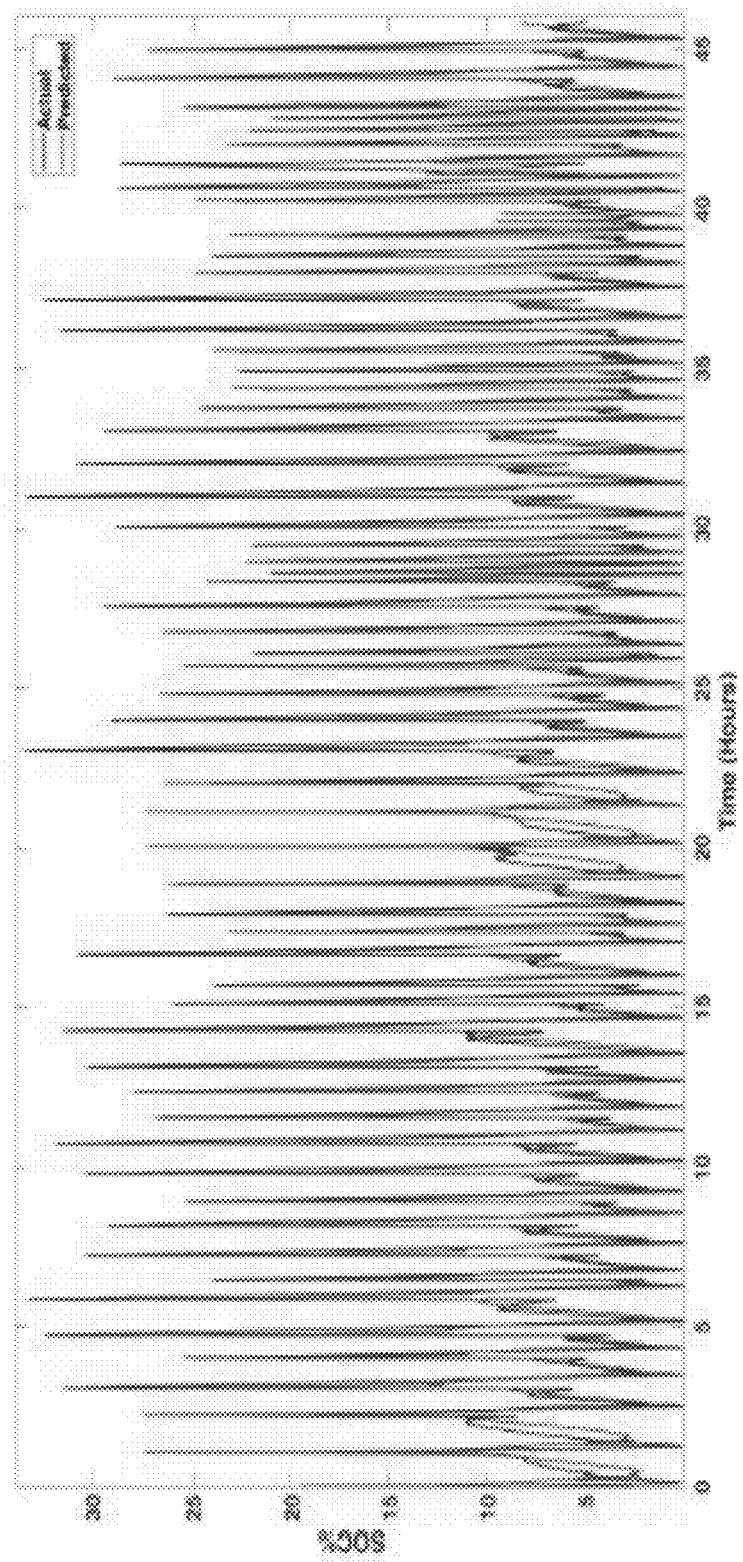
FIG. 7(a) shows a plot of SOC % versus time (in h) showing a comparison of actual and NARX-net forecasted/predicted values of SOC % for C/10 C-rate obtained using GDX with ARIMA forecasted (NARX model 1) values.
Figure 7B:
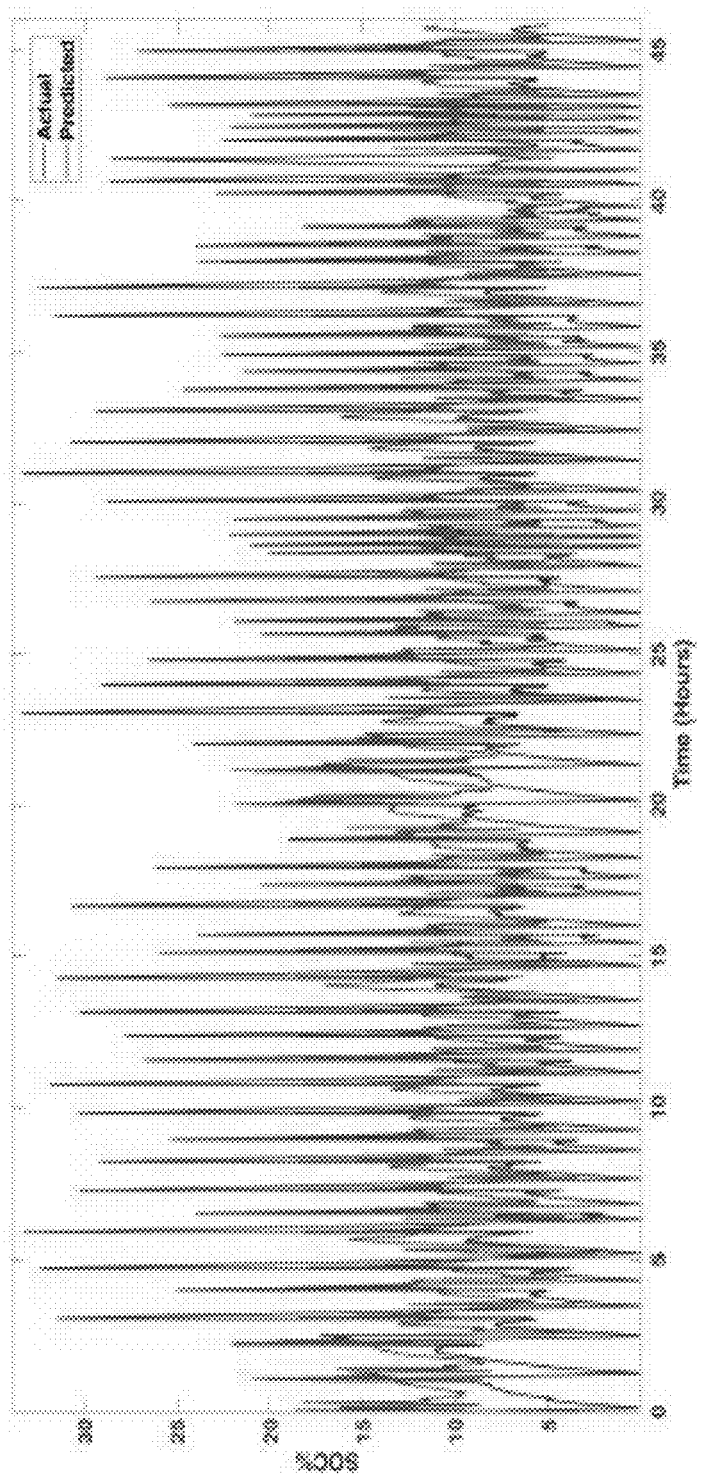
FIG. 7(b) shows a plot of SOC % versus time (in h) showing a comparison of actual and NARX-net forecasted/predicted values of SOC % for C/10 C-rate obtained using rprop with ARIMA forecasted (NARX model 1) values.
Figure 7C:
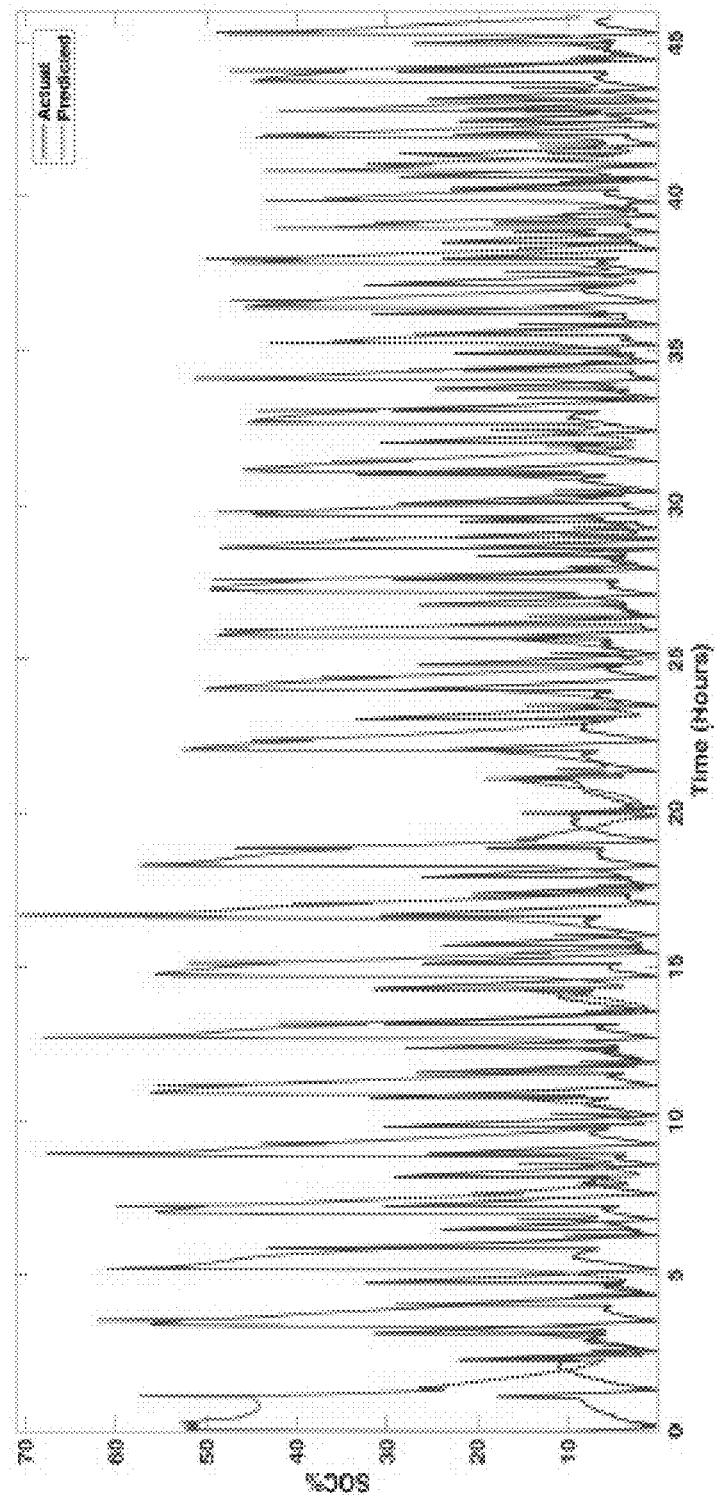
FIG. 7(c) shows a plot of SOC % versus time (in h) showing a comparison of actual and NARX-net forecasted/predicted values of SOC % for C/10 C-rate obtained using GDX with HWES forecasted (NARX model 2) values.
Figure 7D:
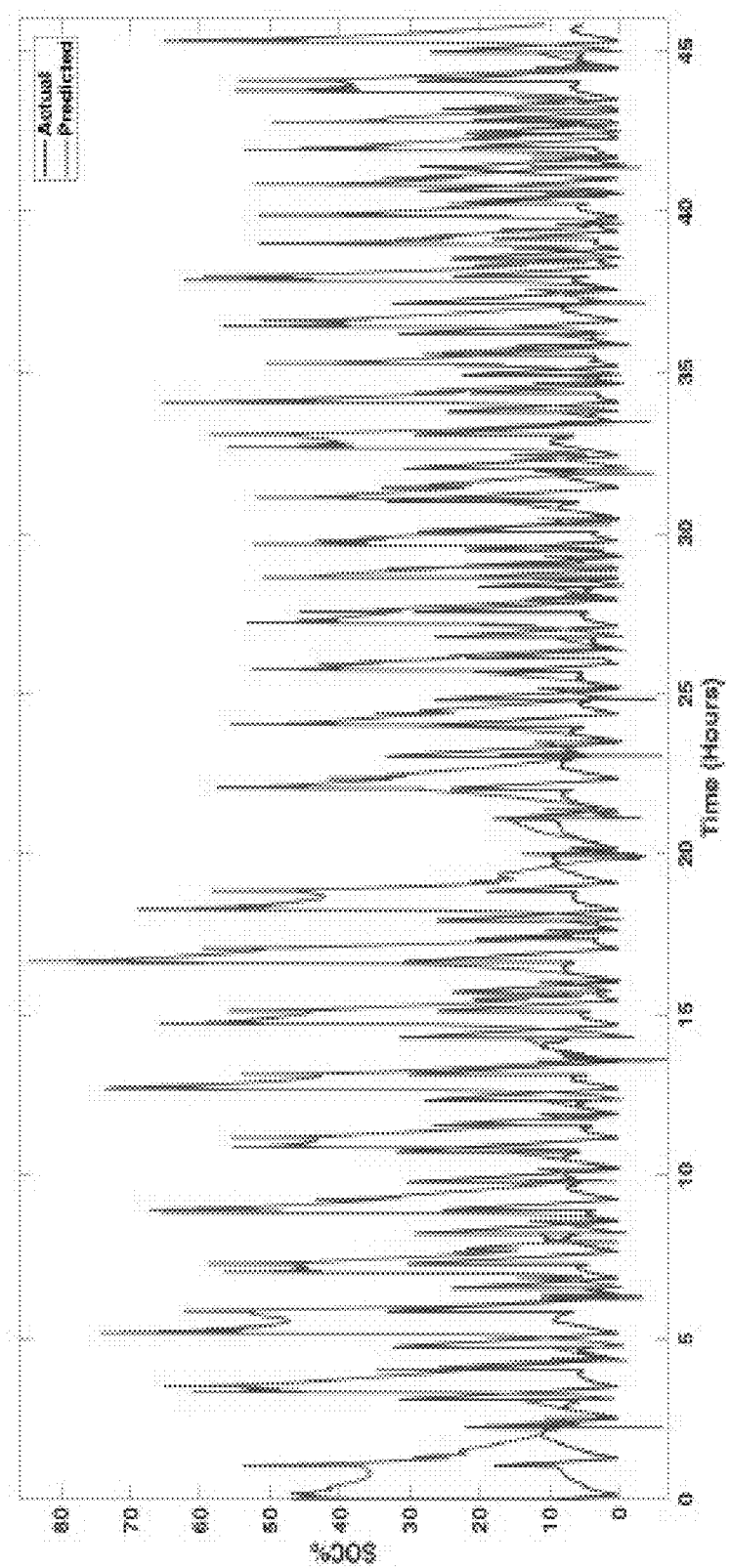
FIG. 7(d) shows a plot of SOC % versus time (in h) showing a comparison of actual and NARX-net forecasted/predicted values of SOC % for C/10 C-rate obtained using rprop with HWES forecasted (NARX model 2) values.
Figure 7E:
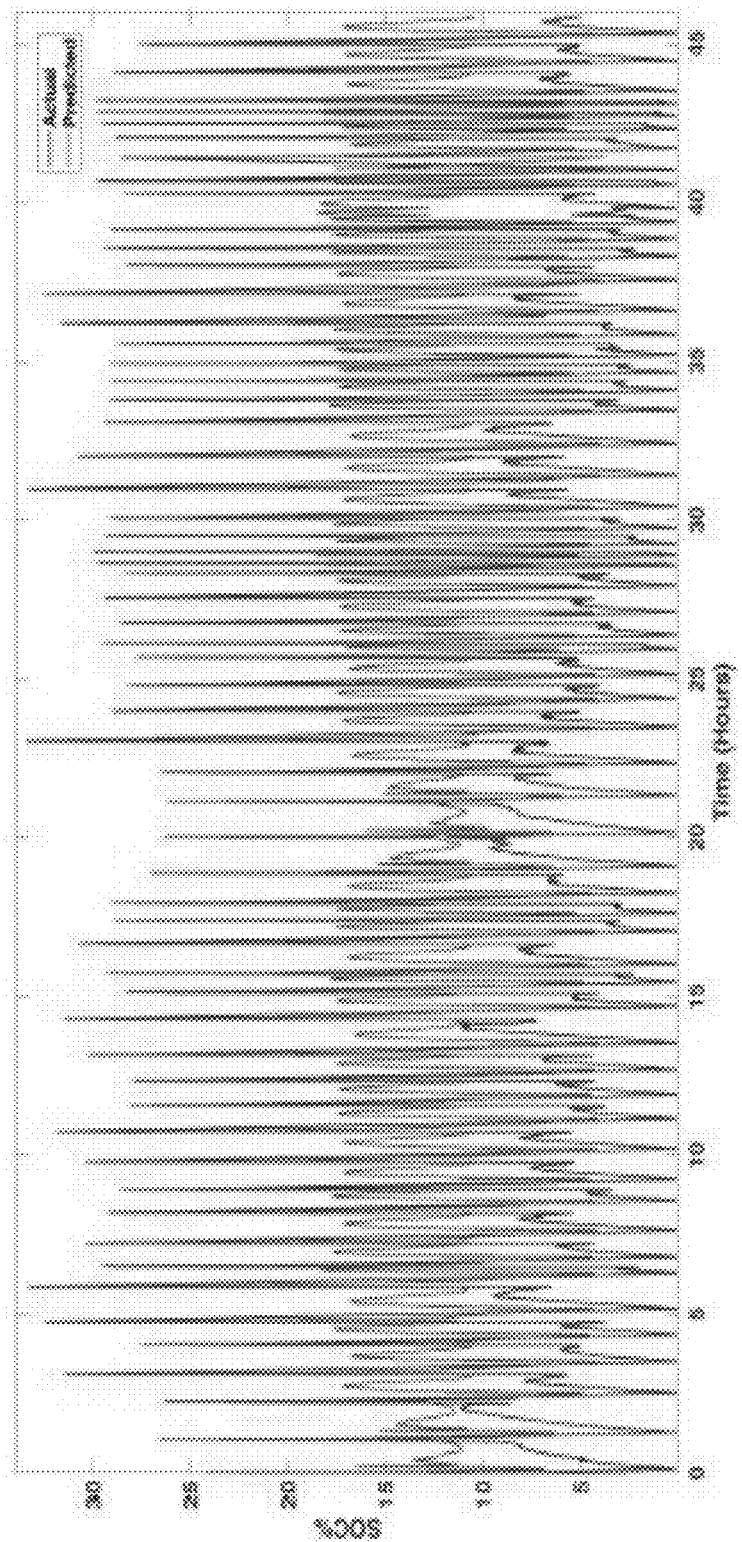
FIG. 7(e) shows a plot of SOC % versus time (in h) showing a comparison of actual and NARX-net forecasted/predicted values of SOC % for C/10 C-rate obtained using GDX with observed (NARX model 3) values.
Figure 7F:
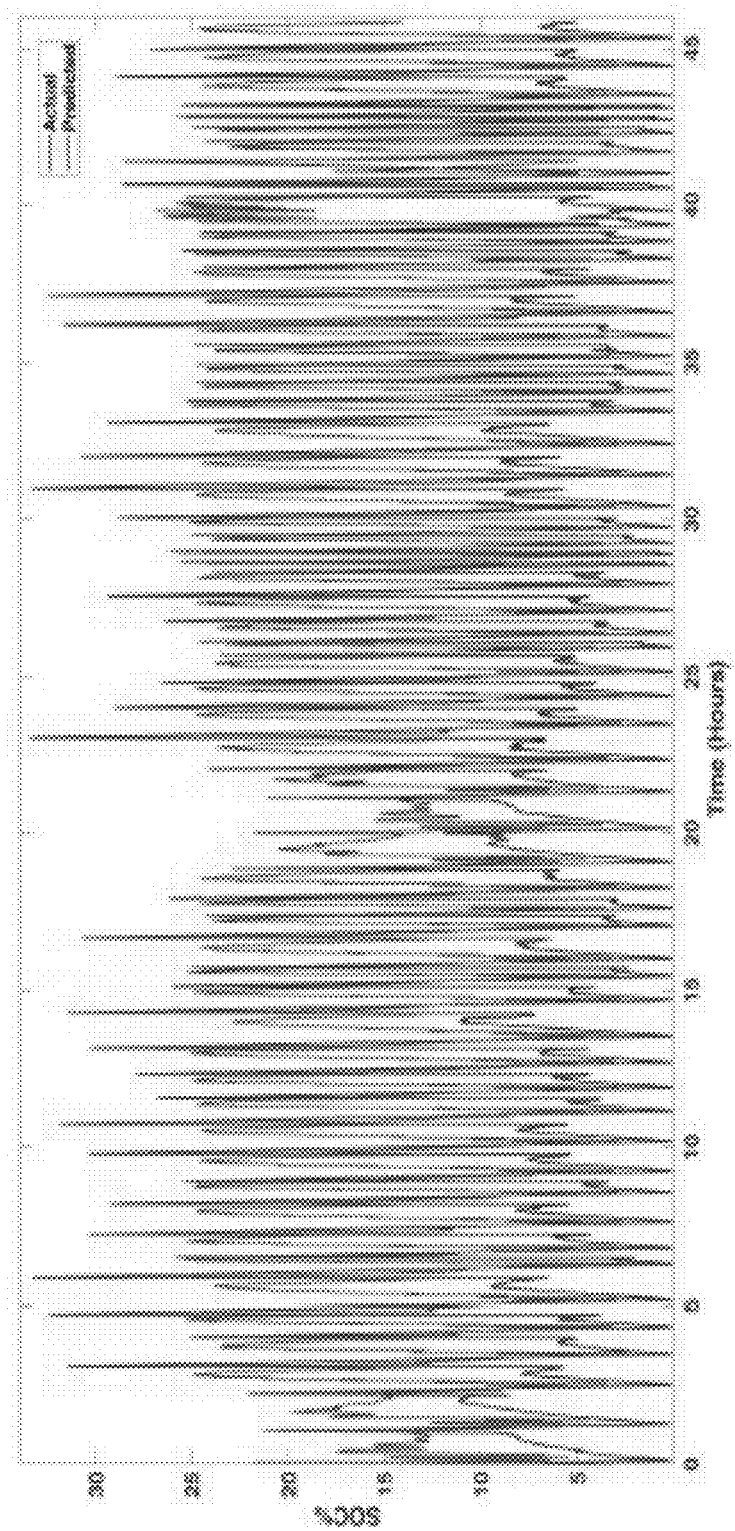
FIG. 7(f) shows a plot of SOC % versus time (in h) showing a comparison of actual and NARX-net forecasted/predicted values of SOC % for C/10 C-rate obtained using rprop with observed (NARX model 3) values.

This stationarity confirmation allows advancement to the third step. The third step now requires identification of three sets of p, d, and q values, each for V, I, and computed SOC %, to allow prediction of these parameters at C/10 rate. Algorithm 1 is used to iteratively compute the p, d, and q values by minimizing the Aikaike Information Criterion (AIC). A heuristic approach to determine AR(p) and MA(q) terms using a partial autocorrelation function and a correlation function can also be used. $y_{x_j}(t)$ in ARIMA($y_{x_j}(t)$, p, d, q) is fed with the original V, I, and computed SOC % datasets individually. If for a given data and a chosen (p, d, q) order, the AIC(•) value is reduced, then the chosen order becomes the final order for the given data. Algorithm 1 begins by selecting a very high value of AIC, and choosing a (p, d, q) order. This algorithm repeats until the AIC value is no longer able to be minimized. If the resulting AIC value (line 4 of Algorithm 1) turns out to be lower than the selected value and cannot be reduced further, the chosen (p, d, q) order is selected as the final order for the corresponding dataset. With the given time-series training dataset, the values that satisfy the AIC minimization criteria are (4,2,4) for V, (5,2,0) for I and (5,0,2) for SOC %. The forecasting errors, specifically Root Mean Square Error (RMSE), Mean Square Error (MSE), and Mean Absolute Error (MAE) are shown in FIG. 8 and the corresponding plots are shown in FIGS. 5(a)-5(c), respectively.

HWES Models

A seasonal additive simple forecasting (also termed as, simple or single exponential smoothing) of sequence plot data with defined repetition periods is a type of HWES method that can be used in embodiments of the subject invention. Seasonality represents the deviation of the data from the overall average. Stationarity of all the training datasets were verified as discussed above.

As can be seen from the actual plots of V, I, and SOC % in FIGS. 5(a)-5(f), the seasonality is additive in nature with a constant trend pattern. One such model can be formulated in the recurrence form by:

$$\hat{y}_{x_0}(t+1|t) = l(t) + b(t-p+1) \qquad (3)$$

where, $$b(t) = \delta(y_{x_i}(t) - l(t)) + (1-\delta)b(t-p) \qquad (4)$$

and $$l(t) = \beta(y_{x_i}(t) - b(t-p)) + (1-\beta)l(t-1) \qquad (5),$$

where $l(t)$ is the smoothed level of $y_{x_i}(t)$, $\beta$ is the smoothing parameter coefficient for level indices, $b(t)$ is the smoothed seasonal index at t, p is the number of periods in the seasonal cycle, and $\delta$ is the smoothing parameter coefficient for seasonal indices The model is individually trained using each of the original V, I, and computed SOC % time-series datasets (represented by $y_{x_i}(t)$) corresponding to C/2 through C/8 rates concatenated in the order of decreasing C-rates, thereby creating three different time-domain based HWES models. The models are then fitted onto each of the training dataset by identifying the coefficients using trial and error, based on the forecast and the resulting Sum of Squared Error (SSE) values identified. $\hat{y}_{x_0}((t+1|t)$ the 1-step ahead HWES forecast given values at t. The forecasted value is formulated as follows in the weighted form:

$$\hat{y}_{x_0}(t+1|t) = \beta y(t) + (1-\beta)\hat{y}_{x_0}(t|t-1) \qquad (6)$$

Based on the $\hat{y}_{x_o}((t+1|t)$ value obtained from Equation (3) using the coefficients $\beta$ and $\delta$ identified from Equations (4) and (5), and the $\hat{y}_{x_o}((t+1|t)$ value obtained from Equation (6), SSE is computed as follows:

$$SSE = \sum_{t=1}^{T} [\hat{y}_{x_o}(t|t-1) - y_{x_i}(t)]^2, \qquad (7)$$

The fitted values are obtained by minimizing SSE for every $\beta$ and $\delta$ coefficient value computed for the respective dataset. The C/10 rate forecasted values are then obtained by replacing t with T (total time period of Mt)) in Equations (3)-(6), with the results shown in FIGS. 5(d)-5(f). The corresponding forecasting errors are listed in FIG. 8. Because this model applies the smallest weights to the oldest observations, a learning delay can be noticed in the first few cycles of C/10 rate forecasted values.

MLP Models

Four time-domain based MLP models (MLP Models 1, 2, 3, and 4) can be built and simulated. All four models include three hidden layers: t=2 with 16 neurons, t=3 with 11 neurons, and t=4 with 6 neurons, respectively, and an output layer. In MLP Models 1 and 2, C/10 data predicted using univariate models: ARIMA and HWES, respectively, including predicted V, I, and experimental t are fed into MLP as training datasets. The testing dataset comprising C/10 predicted SOC %, is used for model performance evaluation. MLP Model 3 uses experimentally obtained V, I, and t datasets, as the training datasets, fed directly into the MLP. MLP Model 4 uses experimentally obtained V, I, Temperature (°T), Power (P) and t datasets, as training datasets, fed directly into the MLP. Performance of MLP Models 3 and 4 was evaluated using C/10 computed SOC % values (testing dataset). Training datasets used in the standalone MLP Models 3 and 4 corresponded to C/2 through C/8 rates concatenated in the order of decreasing C-rates. A simplified data flow of all the MLP models is shown in FIG. 2.

Figure 2:
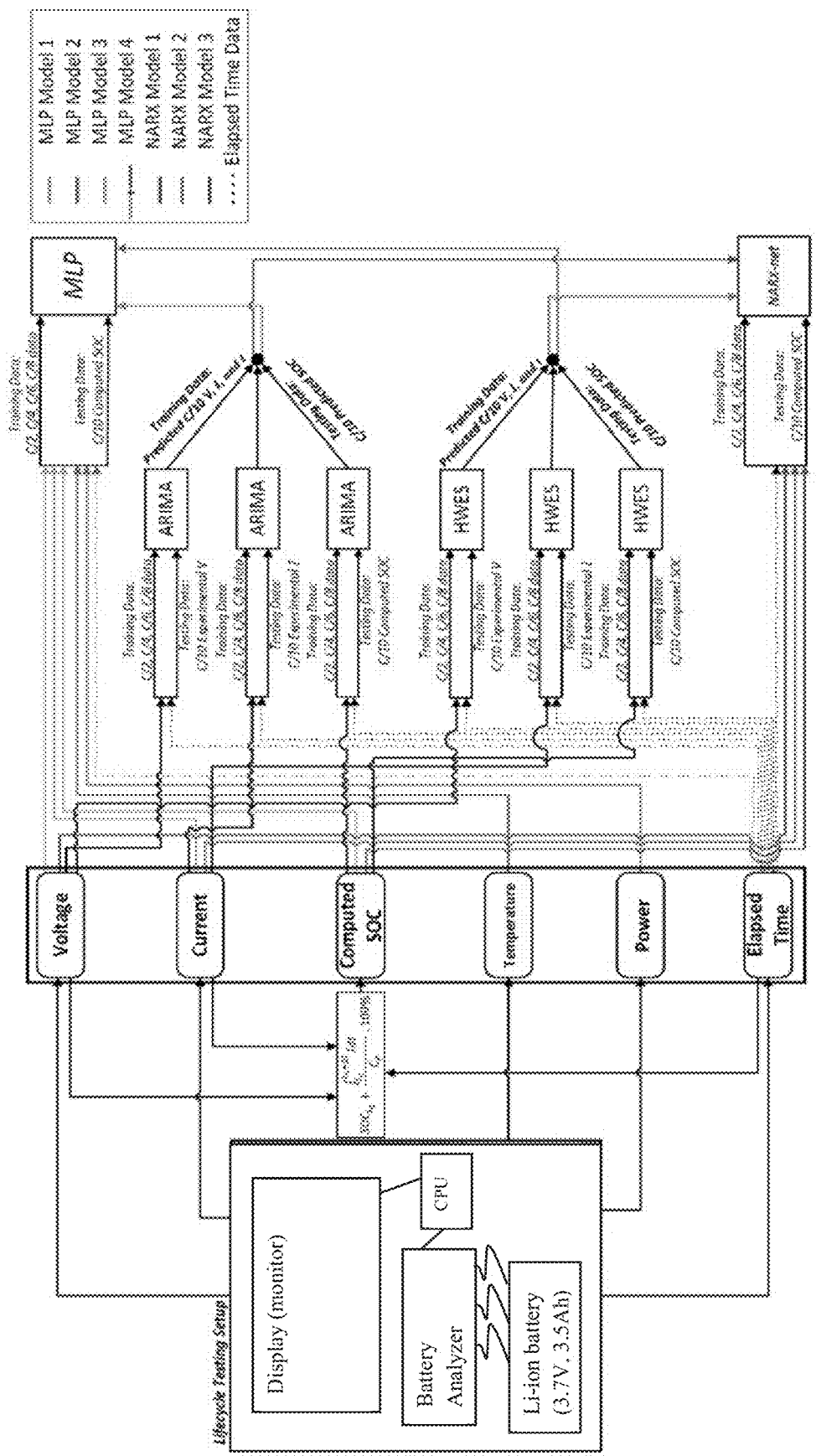
FIG. 2 shows a flowchart of lifecycle testing setup, dataset flow, and models used in embodiments of the subject invention.

The input layer of MLP Models 1, 2, and 3 include three input features and MLP Model 4 includes five input features (see FIG. 3), also shown in FIG. 2. The applicable training dataset for each model is scaled to a range of [0, 1], using a Min-Max scaling method.

Forward Propagation is performed initially after scaling the input features, followed by backpropagation (BP). Each MLP model is simulated for 1000 epochs with unit batch size. Output activations of each hidden layer is given by:

$$v_j^{(\ell)} = g\left(\sum_{i=1}^{j-1}(w_{ji}^{(\ell)}\alpha_i)\right) \quad (8)$$

where v is MLP input features count for $\ell=3$ or 4, $\alpha$ is the MLP input features count for $\ell=2$, $\ell$ is the MLP layer index, j is the MLP neurons count in the $\ell^{th}$ hidden layer (s.t. $j \in \mathbb{Z}^+$), j−1 is the MLP neurons count in the $(\ell-1)^{th}$ hidden layer, $w_{ji}$ is the weight between MLP layers with neurons between j and i, and g is the MLP activation function.

Figure 3:
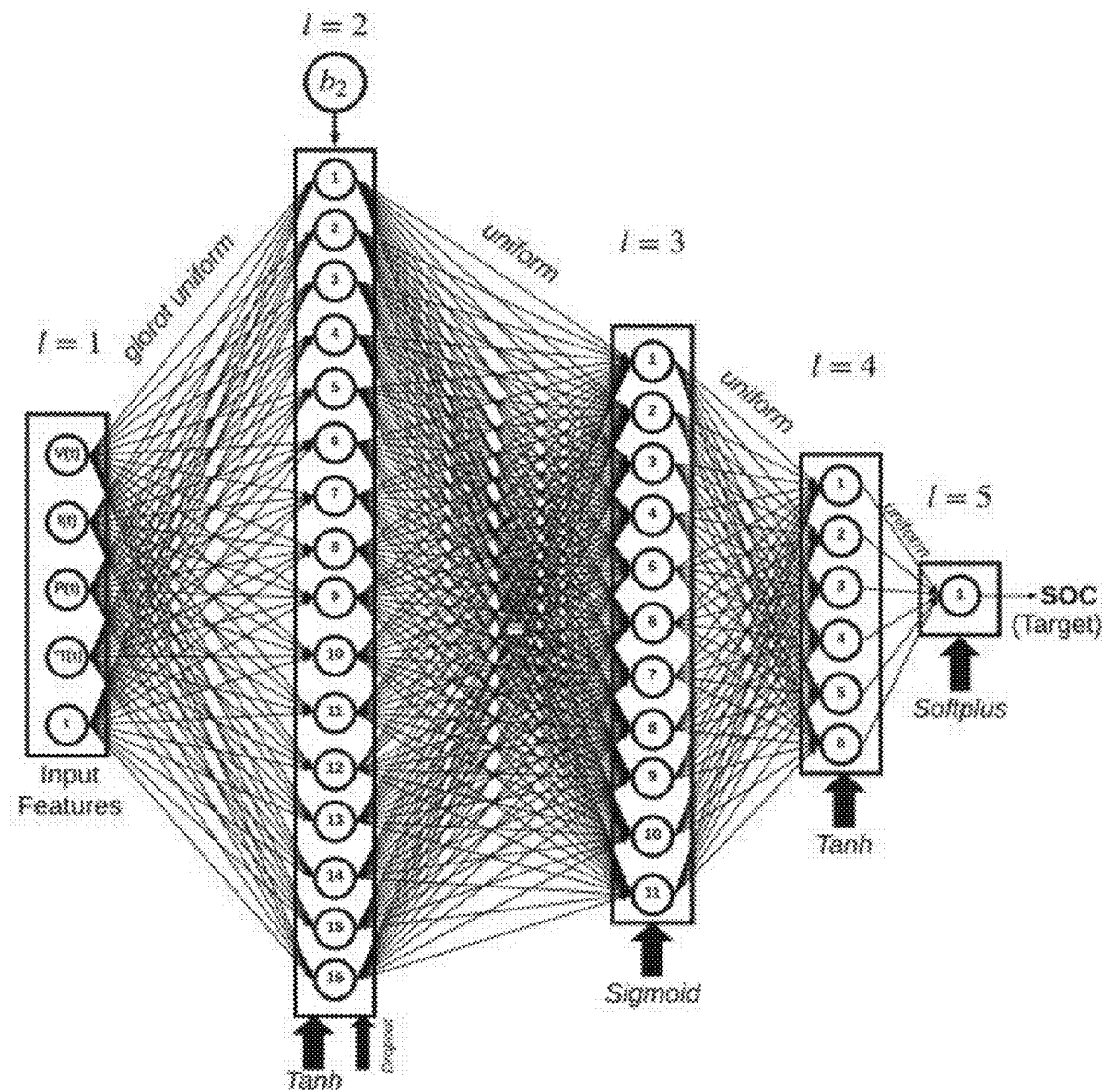
FIG. 3 shows an illustration of a multilayer perceptron (MLP) model (referred to herein as "MLP model 4"), according to an embodiment of the subject invention.

Tan h and Sigmoid are the activation functions for the hidden layers, as shown in FIG. 3. An additional bias vector is added on the hidden layer, $\ell=2$. The final layer uses Softplus as its activation function and its output is given by $$\hat{y}_{x_o}^{(\ell)} = v_j^{(5)}.$$

Uniform and Xavier (Glorot) uniform distributions are used to initialize the weights between the input and final layer to achieve faster convergence during the training stage. For the final layer, the loss function (mean square error) value which must be reduced is formulated as $$\mathcal{L}(\hat{y}_{x_o}^{(\ell)}, \hat{y}_{x_i}^{(\ell)}) = \frac{1}{m}\sum_{k=1}^{m}(\hat{y}_{x_o(k)}^{(\ell)} - \hat{y}_{x_i(k)}^{(\ell)})^2, \quad (9)$$

where m is the number of MLP training samples and k is an arbitrary number used for the summation to m. In addition, $x_i$ includes ARIMA predicted values for MLP Model 1, HWES predicted values for MLP Model 2, and original values for the standalone MLP Models 3 and 4. $x_O$ is the MLP predicted SOC % for C/10 rate. The error in BP due to weight update between t and t−1 layers using the gradient descent update rule formulated by Equation (10) and is used to minimize mean square error between the actual and predicted values during training and testing.

$$w_{jj-1}^{(\ell)} = w_{jj-1}^{(\ell-1)} + \eta\left(\frac{\partial \mathcal{L}(\hat{y}_{x_o}^{(\ell)}, \hat{y}_{x_i}^{(\ell)})}{\partial W_{jj-1}^{(\ell)}}\right)v_j^{(\ell-1)} \quad (10)$$

where, $$\frac{\partial \mathcal{L}(\hat{y}_{x_o}^{(\ell)}, \hat{y}_{x_i}^{(\ell)})}{\partial W_{jj-1}^{(\ell)}} = \frac{2}{m}(g^{(\ell)'} - v_j^{(\ell)})\alpha_i^{(\ell-1)}g^{(\ell)'}(w_{jj-1}^{(\ell)'}\alpha_i^{(\ell-1)}) \quad (11)$$

∀ i ranging from j to α for respective layer $\ell$, where $w_{jj-1}^{(l)}$ is the weight between MLP layers with neurons between j and j−1, and $W_{jj-1}^{(l)}$ is the derivative of vector $w_{jj-1}^{(l)}$. Stochastic gradient descent (sgd), Adam, RMSprop, AdaGrad, AdaMax, AdaDelta, and Nesterov Adam (NAdam) are the optimizers that were applied to Equation (10). Their respective performances are shown in FIG. 9. The learning rates (η) selected in the Equation (11) update for the respective optimizers are 0.01, 0.001, 0.001, 0.01, 0.002, 1, and 0.002. Additional analysis involving evaluation of MLP Models 1 and 2 performance by replacing their testing data consisting of predicted C/10 SOC % outputs with the original C/10 computed SOC % outputs, for the best performing optimizers is shown in FIG. 11. Also, the results corresponding to the best performing optimizers for all the MLP Models are shown in FIGS. 6(a)-6(h).

NARX-Net Models

Three time-domain based NARX-net models (NARX Models 1, 2, and 3) can be built and simulated. All three models can include one hidden layer (f=2) with 10 neurons, and one output layer (f=3) with one neuron, both containing one bias each, where f is the NARX-net feedback delay. The activation functions applicable to f=2 and f=3 are hyperbolic tangent sigmoid (TanSig) and linear, respectively. In NARX Models 1 and 2, C/10 rate data predicted using univariate models ARIMA and HWES, respectively, including predicted V, I, and experimental t being fed into NARX-net as training datasets. The testing dataset comprising C/10 rate predicted SOC % can be used for evaluating the model's performance. NARX Model 3 uses experimentally obtained V, I, and t datasets corresponding to C/2 through C/8 rates concatenated in the order of decreasing C-rates, as the training datasets, fed directly into this standalone NARX-net model. The testing dataset comprising C/10 rate computed SOC % is used for the model's performance evaluation. A simplified data flow of all the NARX-net models is shown in FIG. 2. All three models include input features (or variables) V, I, and t in f=1. The unique feature of NARX, taken into account here, is its closed loop formed using 6 feedback delays fed back from the target variable (predicted/forecasted C/10 rate SOC %) into f=1.

NARX-net models can be formulated using the mapping function G('), approximated by MLP as:

$$\hat{y}_{x_0}(t) = G(y_{x_i}(t), y_{x_i}(t-1), \ldots, y_{x_i}(t-d), \hat{y}_{x_0}(t-1), \ldots, \hat{y}_{x_0}(t-f)) \quad (12)$$

where, $x_i$ includes ARIMA predicted values for NARX Model 1, HWES predicted values for NARX Model 2, and original values for the standalone NARX Model 3. $x_O$ is the NARX predicted/forecasted SOC % for C/10 rate. The NARX-net loss function follows Equation (9) used in MLP modeling. Each NARX-net model was simulated for 1000 epochs with unit batch size. Optimizers such as Bayesian Regularization (br), Levenberg-Marquardt (lm), Scaled Conjugate Gradient (scg), GDX, Gradient Descent (gd), Gradien Descent with Momentum (gdm), BFGS Quasi-Newton (bfg), Resilient Backpropagation (rprop), Conjugate Gradient with Powell/Beale Restarts (cgb), Fletcher-Powell Conjugate Gradient (cgf), Polak-Ribiere Conjugate Gradient (cgp), and One Step Secant (oss) were applied to Equation (12). Their respective performances are shown in FIG. 10. Additional analysis involving evaluation of NARX Models 1 and 2 performance by replacing their testing data consisting of predicted C/10 SOC % outputs, with the original C/10 computed SOC % outputs, for the best performing optimizers is shown in FIG. 12. Also, the results corresponding to the best performing optimizers for all NARX-net Models are shown in FIGS. 7(a)-7(f).

Embodiments of the subject invention can use combinations of univariate models with machine learning techniques in a multi-step approach to forecast SOC % values for a lower C-rate (C/10) using parameters from lifecycle testing at higher C-rates (e.g., one or more of C/2, C/4, C/6, and C/8). Though C/2, C/4, C/6, C/8, and C/10 have been discussed herein, these are for exemplary purposes only and should not be construed as limiting; the systems and method discussed herein can be used to predict any C-rate using any one or more other C-rate (e.g., higher C-rate(s)). In an embodiment, the forecasting approach can include the following steps: (a) first, C/10 rate V, I, and SOC % values can be forecasted using one or more ARIMA models; (b) then, the same C/10 rate V, I, and SOC % values can be forecasted using HWES models; (c) the forecasted data obtained from ARIMA models can then be fed into an MLP model and/or a NARX-net model; (d) the forecasted data obtained from HWES models can then be fed into an MLP model and/or a NARX-net model; and (e) the experimentally obtained parameters and computed SOC % can also be fed directly into an MLP and/or a NARX-net model for additional analysis. Any of these steps can be omitted (e.g., steps (b), (d), and (e) can be omitted). The results obtained from steps (c)-(e) were analyzed in the examples for seven optimizers in MLP and twelve optimizers in NARX-net. Among the univariate models discussed, ARIMA showed superior performance compared to HWES for battery parameter prediction/forecasting.

Embodiments of the subject invention provide novel and advantageous systems and methods for controlling hybrid energy storage systems and integrating controllers for hybrid energy storage systems into other applications including microgrids, electric vehicles, and electric bicycles (bikes). Embodiments contribute towards the goal of development and effective integration of a controller for a hybrid energy storage system into microgrids, electric vehicles, and electric bikes.

Energy Storage or battery management systems for lithium-ion (Li-ion) batteries require accurate prediction of state of charge (SOC). Embodiments of the subject invention can use a combinatorial model involving ARIMA and NARX-net. ARIMA can be used to first predict cell current and cell voltage (e.g., for the desired higher C-rate (C/10)) only using the voltage and current from historical, lower C-rates (C/2 to C/8) (e.g., of an actual 3.7V, 3.5 Ah Li-ion battery). The NARX-net can be used to predict SOC using the voltage and current values predicted by ARIMA. To train NARX-net, at least one algorithm (e.g., four algorithms) can be used, and the performance of the algorithm(s) can be evaluated by comparing the predicted SOC values with those obtained experimentally for the higher C-rate (e.g., C/10). Results have shown that the data-driven model of embodiments of the subject invention is effective at predicting SOC for Li-ion batteries given some preliminary historical data on current and voltage of previous, lower C-rates.

Embodiments of the subject invention can use an ARIMA-NARX model, which is capable of predicting SOC for higher charging/discharging rates (C-rates), given preliminary data of lower C-rates. Embodiments can compare the performance of different algorithms to train NARX-net and/or conduct a multi-level predictive analysis that uses experimental values only for model training and makes out-of-sample predictions.

Techniques to predict SOC can be categorized into look-up table-based, ampere-hour integral-based, model-based prediction, and data-driven prediction. Methods include artificial neural networks, coulomb counting, and Kalman filters, among which coulomb counting is the most widely used. However, coulomb counting shows a loss in accuracy of almost 15% over a few cycles of the battery usage, when used directly for SOC calculation. Embodiments of the subject invention can implement an ARIMA-NARX model on estimated current and voltage values on varying C-rates to estimate SOC for higher, unknown C-rates.

In embodiments, a combination of ARIMA and NARX-net can be used to forecast the SOC values for an unknown C-rate of C/10 using solely the cell voltage, cell current, and elapsed time values solely from previous C-rates of C/2 through C/8. The forecasting can be done in two steps: first forecasting the C/10 voltage and current values from their corresponding values from C/2-C/8 using an ARIMA model; and then using these forecast values to predict the SOC using a NARX-net model. The results were compared for four different training algorithms, and it was found that the ARIMA-NARX combination performed better at predicting SOC when the NARX-net was trained with the GDX algorithm (see Example 1). Prediction of future lifecycles of Li-ion battery data, remaining useful life, state of health, taking into account ageing of the battery, can also be conducted. Models for comparison between and analysis of the chemistry lifecycle can also be used for different C-rates in conjunction with predictive capabilities.

Embodiments of the subject invention provide novel and advantageous systems and methods for controlling hybrid energy storage systems and integrating controllers for hybrid energy storage systems into other applications including microgrids, electric vehicles, and electric bicycles (bikes). Embodiments contribute towards the goal of development and effective integration of a controller for a hybrid energy storage system into microgrids, electric vehicles, and electric bikes.

A controller according to an embodiment of the subject invention can employ the following six methods and designs to control hybrid energy storage systems and integrate into other applications.

1. Estimate in-sample and out-of-sample lithium battery parameters for battery model lifecycle, and ageing prediction using machine learning models. This prediction can assist in identifying the capacity degradation of batteries, thereby identifying the replacement period of batteries in a microgrid and/or large- and medium-scale electric vehicles settings. This estimation also analyzes the applicability of a microgrid battery for a second use in electric vehicles or electric bikes, thereby minimizing replacement expenses.

2. Control and optimization of charge flow through each cell of a battery stack and between the battery and super-capacitor in a hybrid energy storage system. The charge flow through the battery system is controlled using control algorithms in a battery-supercapacitor management system. This system can comprise voltage and state of charge equalization circuits and a microcontroller that feeds the control algorithm to control and/or optimize the charge flow through each cell of the battery and between the battery and supercapacitor, including charging and discharging operations.

3. A battery-supercapacitor management system can comprise a centralized and distributed battery voltage circuit and/or state of charge equalization circuit that reduces balancing time and increases efficiency. This variety of having centralized and distributed topologies makes the system applicable for a multitude of applications, including but not limited to microgrids, electric vehicles, and electric bikes.

4. Identify nearby magnetic and thermal fields optimal for installation and operation of the hybrid energy storage system. The battery-supercapacitor management system can also comprise a suitable thermal management system, which can effectively dissipate the unwanted heat.

5. Recommend optimal inverter settings (in the case of microgrid application) to switch to islanding, anti-islanding, intentional islanding (scheduled and unscheduled), and dynamic voltage-VAR, voltage-Watt, and frequency-Watt operation modes. It can also provide commands to an inverter to operate at low/high voltages, specified power factor, and frequency ride through scenarios. These recommendations and commands can be provided to the inverter based on the PQ meter data.

6. Recommend appropriate control algorithms (in the case of microgrid applications) to perform frequency regulation and PV output smoothing by analyzing battery and supercapacitor state of charge and lifecycle data. This algorithm also defines load dispatch techniques to meet system load requirements at the lowest possible cost, while complying with IEEE 1547-2018. This algorithm, in conjunction with item 1 above, provides an estimated reaction time of the battery in different resulting scenarios.

Embodiments of the subject invention bring a holistic vision to the future smart city as a synergistic integration of its various design, control, and estimation features. The controller can be used by, for example, utilities (e.g., for microgrids), vendors (e.g., for electric vehicles), and consumers (e.g., for electric bikes) during the operational stage. The prediction feature can assist in identifying the battery capacity degradation, thereby identifying the replacement period of batteries in a microgrid and/or large- and medium-scale electric vehicles settings. This estimation and prediction feature also analyzes the applicability of a microgrid battery for a second use in electric vehicles or electric bikes, thereby minimizing the replacement expenses. The control algorithms and centralized and distributed topology designs reduce balancing time and increase efficiency of the overall battery-supercapacitor management system. The thermal management system effectively dissipates unwanted heat, thereby preventing or inhibiting thermal runaway scenarios. The inverter settings can be programmed using control algorithms via automated commands. Additionally, the control algorithms and predictive features estimate the reaction times of the battery in different resulting scenarios.

The algorithms and models can be incorporated into a controller. The individual components of visualization, novel predictive models, and control schemes can be together (e.g., on a grid-connected Battery Energy Storage System (BESS), an electric vehicle, and/or an electric bike). Real-time high-resolution data can be collected from a grid and/or one or more BESSs to validate controller specifications prior to integration and application. Analyses and simulations conducted using real-world data from the system and a 3 MW 12 MWh grid-tied BESS have given good results. The modules of the controller can be tested independently and fine-tuned based on laboratory-level simulations that take real-world data into account. Integration testing can also be conducted by analyzing the interdependencies between the modules of the controller, including their adherence to respective industry standards. Also, an application testing of the entire controller as one single product can be conducted by deploying it on a test-bed, in which component models can be trained against dynamic grid level data and the algorithms can be fine-tuned.

The methods and processes described herein can be embodied as code and/or data. The software code and data described herein can be stored on one or more machine-readable media (e.g., computer-readable media), which may include any device or medium that can store code and/or data for use by a computer system. When a computer system and/or processor reads and executes the code and/or data stored on a computer-readable medium, the computer system and/or processor performs the methods and processes embodied as data structures and code stored within the computer-readable storage medium.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that are capable of storing computer-readable information/data. Computer-readable media should not be construed or interpreted to include any propagating signals. A computer-readable medium of the subject invention can be, for example, a compact disc (CD), digital video disc (DVD), flash memory device, volatile memory, or a hard disk drive (HDD), such as an external HDD or the HDD of a computing device, though embodiments are not limited thereto. A computing device can be, for example, a laptop computer, desktop computer, server, cell phone, or tablet, though embodiments are not limited thereto.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to the invention.

Materials and Methods

A battery analyzer (PCBA 5010-4) was used to perform lifecycle testing to obtain the data in the examples. The datasets obtained from lifecycle testing include voltage (V), current (I), power (P), temperature (T), and time (t). The datasets were obtained by cycling a 3.7 volt (V), 3.5 Ah lithium nickel cobalt aluminum oxide (NCA) battery for 60 half cycles, at variable C-rates. Selected C-rates included C/2, C/4, C/6, C/8, and C/10. The charging and discharging currents applied throughout the lifecycle testing stage were 2.6 Ah and 850 milliamp-hours (mAh), respectively. SOC % was computed for each C-rate, corresponding to every charging/discharging scenario, using Equation (1) above.

The total duration of test executions totaled up to more than 300 hours, which included approximately 87 hours of testing at C/2 rate, 71 hours of testing at C/4 rate, 51 hours of testing at C/6 rate, and 45 hours of testing at C/10 rate. These tests included a rest period of 20 minutes and 10 minutes post every discharge and charge cycle, respectively. The pattern of the test execution periods corresponding to each C-rate is analogous to the size of the interquartile range corresponding to each C-rate in the C-rate versus SOC % box plot, as shown in FIG. 1. All the preliminary step models in the multi-step modeling environment were trained with datasets corresponding to C/2 through C/8 C-rates. Model testings were performed using C/10 rate computed SOC's or univariate model predicted C/10 rate SOC's. Data with t ($=t_0+\Delta t$) was used to build the time-series data, to be used in model formulation and simulation.

Example 1

Figure 4:
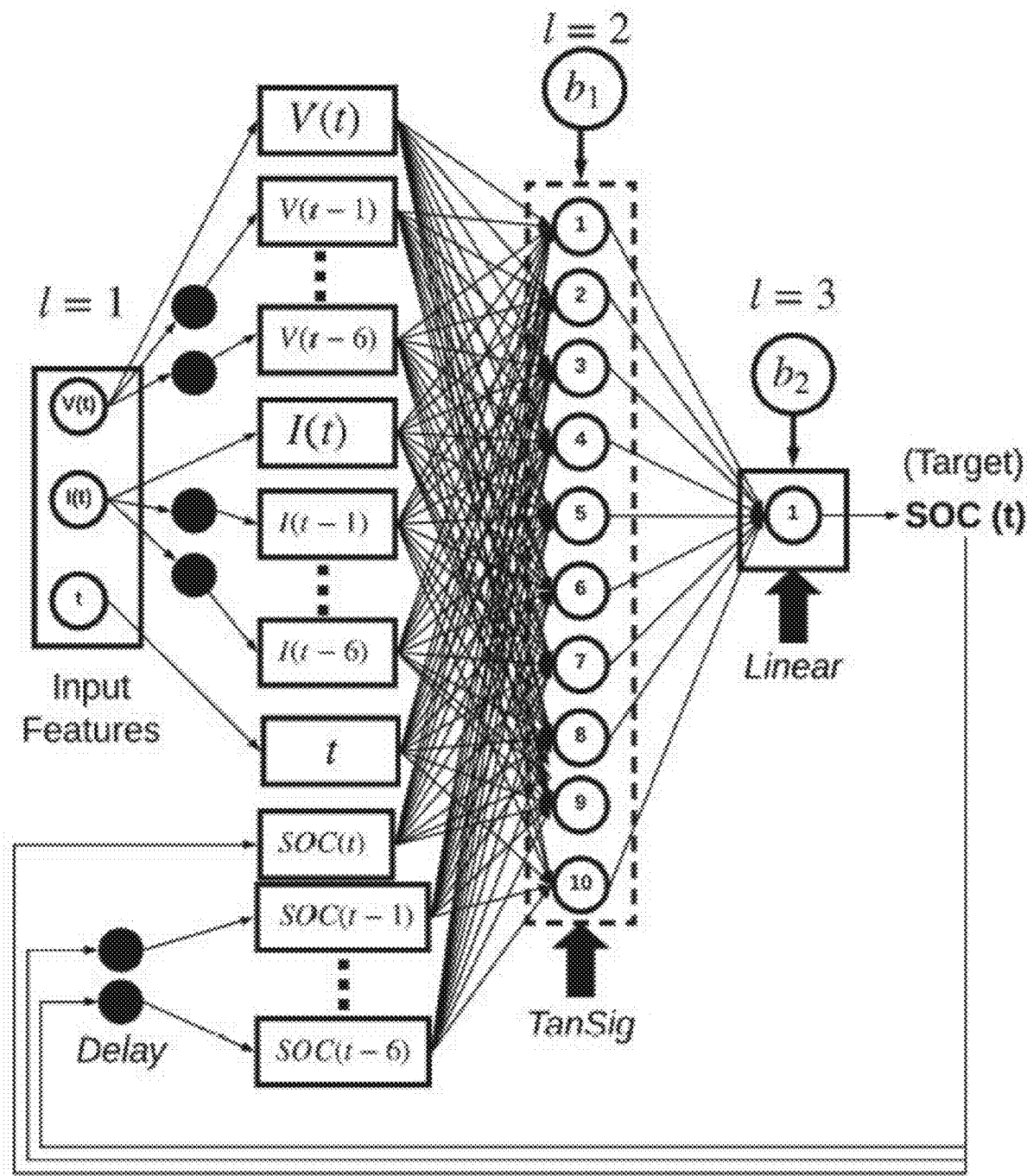
FIG. 4 shows an illustration of Nonlinear autoregressive neural network with external input (NARX-net) models used, according to an embodiment of the subject invention.

Table 1 shows the forecasting errors for the univariate forecasting or single-step forecasting results for V, I, and SOC % shown in FIGS. 5(a)-5(c) for ARIMA, and 5(d)-5(f) for HWES, respectively. ARIMA predicted/forecasted plots are able to trace all the peaks and valleys of the actual (original) data, while HWES predicted plots indicate learning delay, and show inability to track valleys accurately. These univariate results were then passed through MLP and NARX-net models. The MLP and NARX-net models include multiple hidden layers. Selection of these hidden layers was performed using trial and error, based on the loss function (L) value obtained. The hidden layer topology that resulted in the lowest value of loss functions was selected to represent all the respective MLP (FIG. 3) and NARX-net (FIG. 4) Models. FIG. 9 shows the second step prediction errors for MLP Models 1 and 2 and final step prediction errors for MLP Models 3 and 4, and their corresponding convergence speeds (epochs) for the given set of seven optimizers. The testing data used for performance evaluation of MLP Models 1 and 2 is the predicted C/10 rate SOC %. The tabulated results (FIG. 9) for these two models indicated the error induced by the MLP models on the ARIMA 3 and 4 are standalone MLP models with variation in the number of input features. It can be noticed from FIG. 9 that the error values show minor improvement for MLP Model 4 in comparison with MLP Model 3, when AdaMax optimizer is used. This can also be corroborated with the prediction result in FIG. 6(h), where the predicted plot is able to trace most of the peaks and a limited number of valleys as well.

Example 2

Among the seven optimizers considered, a set of two best performing optimizers (AdaGrad and AdaMax) was evaluated further for MLP Models 1 and 2, using computed C/10 rate SOC % as the testing data to analyze multi-step forecasting MLP models performance. The plots corresponding to the values in FIG. 11 for these two models are shown in FIGS. 6(a)-6(d). To perform an overall comparison of the MLP models, the results for MLP Models 1 and 2 from FIG. 11 and for MLP Models 3 and 4 (for AdaGrad and AdaMax optimizers) from FIG. 9 were compared, as these results were obtained by considering computed C/10 rate SOC % as the testing data. The plots corresponding to these results are shown in FIGS. 6(a)-6(h). It can be seen that the inclusion of MLP Models for multi-step modeling reduced the error values. For multi-step prediction, MLP Model 1 performed better than all the other MLP Models (for AdaGrad and AdaMax optimizers), but required longer computation time due to higher number of epochs.

Example 3

FIG. 10 shows the second step prediction errors for NARX Models 1 and 2 and final step prediction errors for NARX Model 3, for the given set of twelve optimizers. The testing data used for performance evaluation in NARX Models 1 and 2 is the predicted C/10 rate SOC %. Among the twelve optimizers considered, a set of the two best performing optimizers (GDX and rprop) was evaluated further for NARX Models 1 and 2, using computed C/10 rate SOC % as the testing data to analyze multi-step forecasting NARX-net models performance. The tabulated results (FIG. 10) for these two models indicated the error induced by the NARX-net models on the ARIMA/HWES predicted data along with their corresponding convergence speeds (epochs). It can be seen by comparing the results of these two NARX-net models from FIGS. 10 and 12 that the multi-step prediction NARX-net models do not reduce the errors caused by the ARIMA/HWES models. Despite this, the performance of multi-step prediction NARX Model 1 is better than that of NARX Model 3 (the standalone single-step prediction NARX-net model), when using GDX optimizer. The plots corresponding to the values in FIG. 12 for these two models are shown in FIGS. 7(a)-7(d). The results tabulated in FIGS. 11 and 12 required the same number of epochs as FIGS. 8 and 10, for the respective models.

The overall results for SOC % forecasting for a lower C-rate showed: a) when using a standalone MLP model, forecasting/prediction using an AdaMax optimizer with a higher number of features gave best results; b) for multi-step forecasting using MLP, MLP Model 1 using the AdaMax optimizer gave the best results; c) when using a standalone NARX model, the GDX optimizer gave the best results; and d) among the multi-step forecasting approaches, NARX Model 1 using GDX optimizer gave the best results.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A system for forecasting state of charge (SOC) of a battery, the system comprising:
   a battery analyzer configured to connect to the battery;
   a processor in operable communication with the battery analyzer; and
   a machine-readable medium in operable communication with the processor and the battery analyzer, the machine-readable medium having instructions stored thereon that, when executed by the processor, perform the following steps:
   obtaining data about the battery from the battery analyzer;
   forecasting a first C-rate, a voltage, a current, and a SOC percentage (SOC %) of the battery using a univariate model with parameters from at least one second C-rate, each second C-rate of the at least one second C-rate being higher than the first C-rate; and providing the forecasted first C-rate, voltage, current, and SOC % to a machine learning model to obtain a forecasted SOC of the battery, the providing of the forecasted first C-rate, voltage, current, and SOC % to the machine learning model to obtain the forecasted SOC of the battery comprising using an optimizer together with the machine learning model, the optimizer being a Variable Learning Rate Gradient Descent (GDX) optimizer or an AdaGrad optimizer.

2. The system according to claim 1, the univariate model being an Auto Regressive Integrated Moving Average (ARIMA) model.

3. The system according to claim 1, the univariate model being a Holt Winters Exponential Smoothing (HWES) model.

4. The system according to claim 1, the machine learning model being a Multilayer Perceptron (MLP) model.

5. The system according to claim 1, the machine learning model being a nonlinear autoregressive neural network with external input (NARX-net) model.

6. The system according to claim 1, the first C-rate being a C/10 C-rate.

7. The system according to claim 6, the at least one second C-rate comprising a C/2 C-rate, a C/4 C-rate, a C/6 C-rate, and a C/8 C-rate.

8. The system according to claim 1, the at least one second C-rate comprising a C/2 C-rate, a C/4 C-rate, a C/6 C-rate, and a C/8 C-rate.

9. The system according to claim 1, the parameters from the at least one second C-rate being stored on the machine-readable medium after being obtained by the battery analyzer.

10. The system according to claim 1, the battery being a lithium ion battery.

11. A method for forecasting state of charge (SOC) of a battery, the method comprising:

obtaining, by a processor, data about the battery from a battery analyzer connected to the battery;

forecasting, by the processor, a first C-rate, a voltage, a current, and a SOC percentage (SOC %) of the battery using a univariate model with parameters from at least one second C-rate, each second C-rate of the at least one second C-rate being higher than the first C-rate; and providing, by the processor, the forecasted first C-rate, voltage, current, and SOC % to a machine learning model to obtain a forecasted SOC of the battery, the providing of the forecasted first C-rate, voltage, current, and SOC % to the machine learning model to obtain the forecasted SOC of the battery comprising using an optimizer together with the machine learning model, the optimizer being a Variable Learning Rate Gradient Descent (GDX) optimizer or an AdaGrad optimizer.

12. The method according to claim 11, the univariate model being an Auto Regressive Integrated Moving Average (ARIMA) model.

13. The method according to claim 11, the machine learning model being a Multilayer Perceptron (MLP) model.

14. The method according to claim 11, the machine learning model being a nonlinear autoregressive neural network with external input (NARX-net) model.

15. The method according to claim 11, the first C-rate being a C/10 C-rate, and the at least one second C-rate comprising a C/2 C-rate, a C/4 C-rate, a C/6 C-rate, and a C/8 C-rate.

16. The method according to claim 11, the parameters from the at least one second C-rate being stored on a machine-readable medium in operable communication with the processor after being obtained by the battery analyzer.

17. The method according to claim 11, the battery being a lithium ion battery.

18. A system for forecasting state of charge (SOC) of a battery, the system comprising:

a battery analyzer configured to connect to the battery;

a processor in operable communication with the battery analyzer; and a machine-readable medium in operable communication with the processor and the battery analyzer, the machine-readable medium having instructions stored thereon that, when executed by the processor, perform the following steps:

obtaining data about the battery from the battery analyzer;

forecasting a first C-rate, a voltage, a current, and a SOC percentage (SOC %) of the battery using a univariate model with parameters from at least one second C-rate, each second C-rate of the at least one second C-rate being higher than the first C-rate; and providing the forecasted first C-rate, voltage, current, and SOC % to a machine learning model to obtain a forecasted SOC of the battery, the univariate model being an Auto Regressive Integrated Moving Average (ARIMA) model, the machine learning model being a Multilayer Perceptron (MLP) model or a nonlinear autoregressive neural network with external input (NARX-net) model, the first C-rate being a C/10 C-rate, the at least one second C-rate comprising a C/2 C-rate, a C/4 C-rate, a C/6 C-rate, and a C/8 C-rate, the providing of the forecasted first C-rate, voltage, current, and SOC % to the machine learning model to obtain the forecasted SOC of the battery comprising using an optimizer together with the machine learning model, the optimizer being a Variable Learning Rate Gradient Descent (GDX) optimizer or an AdaGrad optimizer, the parameters from the at least one second C-rate being stored on the machine-readable medium after being obtained by the battery analyzer, and the battery being a lithium ion battery.

* * * * *

UNITED STATES PATENT AND TRADEMARK OFFICE
CERTIFICATE OF CORRECTION

PATENT NO. : 10,969,436 B1  
APPLICATION NO. : 17/080322  
DATED : April 6, 2021  
INVENTOR(S) : Sarwat et al.

Page 1 of 1

It is certified that error appears in the above-identified patent and that said Letters Patent is hereby corrected as shown below:

In the Specification

Column 1, Lines 15-18:
"This invention was made with government support under Award number CNS-1553494 awarded by National Science Foundation. The government has certain rights in the invention."

Should read:
-- This invention was made with government support under 1553494 awarded by the National Science Foundation. The government has certain rights in the invention. --

Signed and Sealed this  
Fourth Day of January, 2022

Drew Hirshfeld  
*Performing the Functions and Duties of the  
Under Secretary of Commerce for Intellectual Property and  
Director of the United States Patent and Trademark Office*